United States Patent
Ittel et al.

(10) Patent No.: US 7,618,704 B2
(45) Date of Patent: *Nov. 17, 2009

(54) SPIN-PRINTING OF ELECTRONIC AND DISPLAY COMPONENTS

(75) Inventors: Steven Dale Ittel, Wilmington, DE (US); Jeffrey Crawford, West Chester, PA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 690 days.

This patent is subject to a terminal disclaimer.

(21) Appl. No.: 10/953,679

(22) Filed: Sep. 28, 2004

(65) Prior Publication Data

US 2005/0089679 A1    Apr. 28, 2005

Related U.S. Application Data

(60) Provisional application No. 60/507,038, filed on Sep. 29, 2003.

(51) Int. Cl.
*B32B 5/16* (2006.01)
*C08K 9/00* (2006.01)

(52) U.S. Cl. .............. 428/323; 427/286; 427/287; 427/266; 427/299; 523/200; 523/202; 428/328

(58) Field of Classification Search .......... 428/303, 428/195.1, 328, 402, 32.34, 406; 523/200, 523/202; 427/498, 457, 512, 125; 430/319, 430/281; 524/556; 264/172.11–172.17
See application file for complete search history.

(56) References Cited

U.S. PATENT DOCUMENTS

| | | | |
|---|---|---|---|
| 2,936,482 A | 5/1960 | Kilian | |
| 2,989,798 A | 6/1961 | Bannerman et al. | |
| 3,583,931 A | 6/1971 | Bouchard | |
| 4,059,949 A | 11/1977 | Lee | |
| 4,129,677 A | 12/1978 | Boe | |
| 4,388,370 A | 6/1983 | Ellis et al. | |
| 4,539,041 A | 9/1985 | Figlarz et al. | |
| 4,755,587 A | 7/1988 | Rinehart | |
| 4,792,573 A | 12/1988 | Cohn | |
| 4,912,019 A | 3/1990 | Nebe et al. | |
| 4,925,771 A | 5/1990 | Nebe et al. | |

(Continued)

FOREIGN PATENT DOCUMENTS

DE    195 22 643 A    1/1996

(Continued)

OTHER PUBLICATIONS

Fuller et al. "Ink-Jet Printed Nanoparticle Microelectromechanical Systems". Journal of Microelectromechanical Systems, vol. 11, No. 1, (2002). pp. 54-60.*

(Continued)

*Primary Examiner*—David R Sample
*Assistant Examiner*—Prashant J Khatri
(74) *Attorney, Agent, or Firm*—Gail D. Tanzer

(57) ABSTRACT

The present invention is directed to a process for printing conductors, insulators, dielectrics, phosphors, emitters, and other elements that may be for electronics and display applications. The present invention also relates to viscoelastic compositions used in this printing process. The present invention further includes devices made therefrom.

35 Claims, 4 Drawing Sheets

U.S. PATENT DOCUMENTS

| | | | |
|---|---|---|---|
| 5,049,480 A | 9/1991 | Nebe et al. | |
| 5,246,811 A | 9/1993 | Higuchi | |
| 5,281,509 A | 1/1994 | Murakata et al. | |
| 5,391,432 A | 2/1995 | Mitchnick et al. | |
| 5,458,971 A | 10/1995 | Hernandez et al. | |
| 6,020,058 A * | 2/2000 | Pekala et al. | 428/32.34 |
| 6,048,389 A * | 4/2000 | Price et al. | 106/31.37 |
| 6,576,732 B1 | 6/2003 | Milligan et al. | |
| 2001/0045547 A1* | 11/2001 | Senecal et al. | 252/501.1 |
| 2002/0122873 A1* | 9/2002 | Mirkin et al. | 427/2.1 |
| 2003/0110978 A1 | 6/2003 | Abe et al. | |
| 2003/0168756 A1* | 9/2003 | Balkus et al. | 264/10 |
| 2004/0009290 A1 | 1/2004 | Carroll et al. | |

FOREIGN PATENT DOCUMENTS

| | | |
|---|---|---|
| EP | 0 250 664 | 1/1988 |
| EP | 0 412 851 A | 2/1991 |
| EP | 1 008 909 A | 6/2000 |
| GB | 772675 | 4/1957 |
| JP | 49-34550 | 3/1974 |
| JP | 57-161115 | 4/1982 |
| JP | 59-47474 | 3/1984 |
| WO | 02/093256 A | 11/2002 |
| WO | 03/032087 A | 4/2003 |
| WO | WO 03/032084 A2 | 4/2003 |
| WO | WO 03/034150 A1 | 4/2003 |

OTHER PUBLICATIONS

J.W. Hoyt et. al., Drag Reduction, Encyclopedia of Polymer Science and Engineering, 1986, pp. 129-151, vol. 53$^{rd}$ Ed.

K. Weissenberg, A Continuum Theory of Rheological Phenomena, Nature, 1947, pp. 310-311, vol. 159.

H.J. Choi et. al., Polymer-Induced Turbulent Drag Reduction, Ind. Eng. Chem.,Res., 1996, pp. 2993-2998, vol. 35.

T. Rho et. al., Degradation of Polyacrylamide in Dilute Solution, Polym. Degrad. Stab., 1996, pp. 287-293, vol. 51.

H.J. Choi et. al., Turbulent Drag Reduction and Degradation of DNA, Phys. Rev. Lett., 2002, vol. 89, Art. No. 088302 (1-4).

K. Sung et. al., Rheological Behavior and Wall Slip of Dilute and Semidilute CPYCl/Nasal Surfactant Solutions, Korea-Australia Rheol. J., 2003, pp. 151-156, vol. 15.

V. Tirtaatmadja et. al., Shear-Induced Structure and Dynamics of Hydrophobically Modified Hydroxy Ethyl Cellulose (HMHEC) in the Presence of SDS, Korea-Australia Rheol. J., 2002, pp. 189-201, vol. 14.

E.D Burger et. al., Studies of Drag Reduction Conducted Over a Broad Range of Pipeline Conditions When Flowing Prudhoe Bay Crude Oil, J. Rheol., 1980, pp. 603-626, vol. 24.

R.H. Sellin et. al., The Effects of Drag-Reducing Additives on Fluid Flows and Their Industrial Applications Part 1: Basic Aspects, J. Hydraulic Res., 1982, pp. 29-68, vol. 20.

R.H. Sellin et. al., Polymer Drag Reduction in Large Pipes and Sewers: Results of Recent Field Trials, J. Rheol., 1980, pp. 667-684, vol. 24.

J. Golda, Hydraulic Transport of Coal in Pipes With Drag Reducing Additives, Chem. Eng. Commun., 1986, pp. 53-67, vol. 43.

International Search Report Dated Jan. 19, 2005 for International Application No. PCT/US2004/032520.

* cited by examiner

SPIN-PRINTING OF ELECTRONIC AND DISPLAY COMPONENTS

FIELD OF THE INVENTION

The present invention is directed to a process for spin printing conductors, insulators, dielectrics, phosphors, emitters, and other elements that may be used for electronics and display applications. The present invention also relates to compositions used in this printing process. The present invention further includes devices made therefrom.

TECHNICAL BACKGROUND

The electronics, display and energy industries rely on the formation of coatings and patterns of conductive and other electronically active materials to form circuits on organic and inorganic substrates. The primary methods for generating these patterns are screen printing for features larger than about 100 µm and thin film and etching methods for features smaller than about 100 µm. Other subtractive methods to attain fine feature sizes include the use of photo-patternable pastes and laser trimming.

It is the trend in the electronics industry to make smaller and less expensive electronic devices that provide higher resolution and enhanced display performance. As a result, it has become necessary to develop new materials and new approaches to manufacture such devices.

Photo-patterning technologies offer uniform finer lines and space resolution when compared to traditional screen-printing methods. A photo-patterning method, such as DuPont's FODEL@ printing system, utilizes a photoimageable organic medium as found in U.S. Pat. No. 4,912,019; U.S. Pat. No. 4,925,771; and U.S. Pat. No. 5,049,480, whereby the substrate is first completely covered (printed, sprayed, coated or laminated) with the photoimageable thick film composition and dried. An image of the circuit pattern is generated by exposure of the photoimageable thick film composition with actinic radiation through a photomask bearing a circuit pattern. Actinic radiation is radiation such as ultraviolet that may cause photochemical reactions. The exposed substrate is then developed. The unexposed portion of the circuit pattern is washed away leaving the photoimaged thick film composition on the substrate that, subsequently, is fired to remove all remaining organic materials and sinter inorganic materials. Such a photo-patterning method demonstrates line resolution of about 30 microns depending on the substrate smoothness, inorganic particle size distribution, exposure, and development variables. When employed for the production of conductors in display devices such as plasma display panels, field emission displays, or liquid crystal displays, the conducting lines can be up to a meter long, many orders of magnitude longer than their widths and precision. The process is necessarily subtractive in its nature as a result of the wash-out of a large portion of the pattern. A process that is additive is desired by those in the industry.

The ink jet printing system is a high resolution, additive printing system having the ability to print complex patterns through digital instructions. This ink jet printing system is a recording system, which prints by discharging ink drops through a discharge orifice such as a nozzle or a slit to thus make the ink drops directly adhere to a printing substrate. Ink jet techniques usually fall into two broad categories: continuous injection systems and on-demand systems. In continuous injection systems, the ink jet is firing a continuous stream of microdrops and the pattern is established by selectively diverting or not diverting those microdrops to a waste reservoir. This system cannot be viewed as fully additive in that the portion of material diverted to the reservoir is lost, making the process less than 100% additive. In the on-demand system, drops are fired only when required. These systems are more prone to clogging when employing inks with high solids content, and it is a common feature that the first several drops on demand may not fire.

The ink mainly used in such an ink jet printing system comprises a dye dissolved in an aqueous or nonaqueous solvent. In the field of conductive inks, a liquid dispersion of ultrafine metal particles has been used in the formation of a conductive circuit making use of the ink jet printing system (US patent application 2003/0110978 A1). Liquid dispersions of other ultrafine particles such as metal oxides, organometallics or polymers may also be used in the formation of components of electronic circuits or display devices using ink jet printing systems.

United States patent application US 2004 (009290) discloses the spinning of conductive fibers or ribbons that are attached to a substrate by spinning a fiber or ribbon composed of an organic polymer with an inorganic material and affixing that fiber or ribbon in a desired orientation on a substrate and finally heating the composition to remove the organic polymer. This results in the conductive fiber or ribbon being affixed to the substrate in the desired orientation. Suitable inorganic materials are generally metal conductors that include Au, Ni, Au—Cr alloy, Au—Ta alloy, Cu—Cr alloy, Au/Indium tin oxide, Cu, Ag, and Ni. These constructions are useful as electrodes particularly on silicon wafers in solar cell fabrication. While several spinning methods are discussed, the concept of utilizing a viscoelastic system in which the concentration of the polymer component is no higher than a few percent is not disclosed. United States patent application US 2004050476 is similar but directed to a process for the fabrication of features on a display panel utilizing fibers or ribbons comprising organic polymers and inorganic material, the inorganic materials being phosphors, conductive metals or dielectric particles. These applications do not anticipate the advantage of using a viscoelastic polymer solution having a low polymer content thereby maximizing the quantity of functional phase materials printed onto the substrate.

It is possible to disperse solids in many synthetic polymers and spin fibers of those polymers. This is practiced with carbon blacks (U.S. Pat. No. 4,129,677, U.S. Pat. No. 4,388,370, and EP 250664), zinc oxide (U.S. Pat. No. 5,391,432), magnesium oxide (JP 57161115), or antimony tin oxide-coated Ti oxide particles (JP 59047474) in nylon for antistatic purpose, both throughout the fiber and in segregated into the core of core-shell compositions. Tin oxide (JP 49034550) has been added as a flame retardant. In all of these examples, the polymer component is an appreciable fraction and usually the majority of the mixture being spun. Conductivities of the resulting system are relatively low because the content of the active phase is necessarily so low. In addition, the fibers would have to be adhered to the substrate surface at very high temperatures for them to adhere. To achieve higher conductivities, the polymer fraction would have to be fired out, but the polymer content is so high that the volatilization process would destroy the lines.

An advantage of the composition in the current invention is that the polymer content is lower than the content of the functional phase and that it may be spun and adhered to the substrate surface at conditions close to ambient.

Various methods for preparing the foregoing liquid dispersion of metal ultrafine particles are known. The metal ultrafine particles or powder can be dispersed together with, for instance, a solvent, a resin and a dispersant, according to various means such as stirring, the applying of ultrasonic waves and mixing in, for instance, a ball mill or a sand mill. Liquid dispersions prepared according to this method have been employed in the fields of inks, paints and varnishes. There have been known, for instance, a method for directly preparing metal ultrafine particles in a liquid phase such as the technique for the evaporation of a metal in a gas phase (subsequently referred to as "evaporation-in-gas" technique) comprising the steps of evaporating a metal in a low vacuum atmosphere in the coexistence of vapor of a solvent, and then condensing the evaporated metal and solvent into uniform metal ultrafine particles to thus disperse the resulting particles in the condensed solvent and to thus give a liquid dispersion (Japanese Patent No. 2,561,537) and those, which make use of an insoluble precipitate-forming reaction or a reducing reaction using a reducing agent. Among these methods for preparing liquid dispersions of metal ultra fine particles, the evaporation-in-gas technique would permit the stable preparation of a liquid dispersion containing metal ultrafine particles having a particle size of not more than 100 nm and which are uniformly dispersed therein. In the evaporation in-gas technique, the amount of a dispersion stabilizer or a component required for the preparation of a liquid dispersion containing metal ultrafine particles in a desired concentration is smaller than that required in the liquid phase preparation technique.

Dispersion of metal or other ultrafine particles must have characteristic properties (such as viscosity and surface tension) required for the ink used in ink jet printing. Ultrafine particles often undergo aggregation and this makes it difficult to prepare any liquid dispersion in which the ultrafine particles are dispersed in a stable manner. For this reason, when using such a liquid dispersion of ultrafine particles as ink for the inkjet printing, the ink suffers from a problem in that aggregates of the ultrafine particles present therein result in clogging of the ink jet nozzles. Moreover, when using a liquid dispersion in which the ultrafine particles are independently or separately dispersed, as ink for the ink jet printing, the liquid dispersion should be prepared using a solvent suitable for satisfying the requirements for characteristic properties of the ink. However, the choice of a solvent suitably used in the ink for the ink jet printing has been quite difficult. The properties required for an ink jet system are often at odds with the requirements for stable dispersions of the ultrafine particles.

Ink jet techniques necessarily require low viscosity fluids for proper operation of the jetting system. It is difficult to build features to any appreciable thickness, though this can be done utilizing multiple passes. Drying time or some other means for stabilizing the initial feature is required between passes. Resolution is often compromised and it is difficult to obtain appreciable feature height to feature width because non-viscous, wetting fluids are employed.

Despite the foregoing advances in such systems, manufacturers are continuously seeking compositions with improved utility of the ultrafine materials and finer resolution of lines and spaces. Such materials will increase the speed of the manufacturing processes without compromising high resolutions in the lines and spaces of the circuit or display patterns. The present invention is directed to such a process, the materials and compositions required for implementation of the process, and the methods for production of said materials.

In solution spinning, a concentrated solution of a polymer is forced through a spinneret. The face of the spinneret is in contact only with a gas, which is usually air. Because solvent evaporation is generally a slow process, after travelling a short distance through the air, typically 0.1-10 cm., the concentrated solution (in the form of a fine "jet") usually enters a coagulant, which extracts the solvent from the polymer, resulting in the formation of a polymer fiber. The coagulant is frequently water or, as in the case of the present invention, air. Importantly, in the gap between the spinneret face and the coagulant, the fiber solution, which is usually quite viscous and somewhat viscoelastic, is drawn, resulting in a smaller diameter jet of polymer solution entering the coagulant than was extruded from the spinneret holes. The amount of drawing that can be done is limited, because above some maximum draw value the fibers tend to break.

SUMMARY OF THE INVENTION

The present invention includes a composition comprising:
(a) between 0.1 and 70 percent by weight of functional phase particles,
(b) a dispersing vehicle, and
(c) between 0.1 and 8 percent by weight of an ultrahigh molecular weight polymer soluble in that dispersing vehicle.

The above composition may have a weight fraction of the functional phase particles of between 0.5 and 50 weight percent and may have various other additives.

The present invention also includes a composition comprising:
(a) between 0.1 and 70 percent by weight of functional phase particles; and
(b) a viscoelastic polymer solution.

The present invention further includes a process for creating an image on a substrate comprising:
a) forcing a deposit composition comprising between 0.1 and 70 percent by weight of functional phase particles, a dispersing vehicle, and between 0.1 and 8 percent by weight of an ultrahigh molecular weight polymer soluble in that dispersing vehicle through an orifice to form a fiber
b) optionally elongating that fiber;
c) depositing that fiber on a substrate; and
d) evaporating the dispersing vehicle from the deposited fiber resulting in the functional phase particles affixed to the substrate in the desired image.
e) and optionally heating the substrate and deposited fiber to a temperature sufficient to effect removal of the organic components.

The present invention also includes a process comprising:
f) forcing a deposit composition comprising between 0.1 and 70 percent by weight of functional phase particles, and a viscoelastic polymer solution through an orifice to form a fiber
g) optionally elongating that fiber;
h) depositing that fiber on a substrate; and
i) evaporating the volatile components from the deposited fiber resulting in the functional phase particles affixed to the substrate in the desired image.
j) and optionally heating the substrate and deposited fiber to a temperature sufficient to effect removal of the organic components.

The present invention further describes a process for creating an image on a substrate comprising:
a) depositing from a dispensing orifice a reservoir of a deposit composition comprising between 0.1 and 70 percent by weight of functional phase particles, a dispersing vehicle, and between 0.1 and 8 percent by weight of an ultrahigh molecular weight polymer soluble in that dispersing vehicle on the surface of a substrate;

b) contacting said reservoir with a finely pointed object wet by the composition;
c) drawing a fiber from said reservoir by removing the finely pointed object from the reservoir and away from the surface of said substrate;
d) translating the finely pointed object to an other point above the substrate such that said fiber extends between said reservoir and said other point;
e) depositing that fiber between said reservoir and another point on the substrate by contacting the finely pointed object to the substrate at that point;
f) evaporating the dispersing vehicle from the deposited fiber resulting in the functional phase particles affixed to the substrate in the desired image; and
g) and optionally heating the substrate and deposited fiber to a temperature sufficient to effect removal of the organic components.

The invention also includes a process comprising:
a) depositing from a dispensing orifice a reservoir of a deposit composition comprising between 0.1 and 70 percent by weight of functional phase particles and a viscoelastic polymer solution onto the surface of a substrate;
b) contacting said reservoir with a finely pointed object wet by the composition;
c) drawing a fiber from said reservoir by removing the finely pointed object from the reservoir and away from the surface of said substrate;
d) translating the finely pointed object to an other point above the substrate such that said fiber extends between said reservoir and said other point;
e) depositing that fiber between said reservoir and another point on the substrate by contacting the finely pointed object to the substrate at that point;
f) evaporating the volatile components from the deposited fiber resulting in the functional phase particles being affixed to the substrate in the desired image; and
g) and optionally heating the substrate and deposited fiber to a temperature sufficient to effect removal of the organic components.

The invention further includes an ink set that comprises at least two compositions
(a) the first composition comprising:
  (b) between 0.1 and 70 percent by weight of functional phase particles,
  (c) a dispersing vehicle,
  (d) between 0.1 and 8 percent by weight of an ultrahigh molecular weight polymer soluble in that dispersing vehicle, and
  (e) optionally other adjuvants
(f) the second composition comprising:
  (g) between 0 and 70 percent by weight of functional phase particles different than those of (b),
  (h) a dispersing vehicle, and
  (i) between 0.1 and 8 percent by weight of an ultrahigh molecular weight polymer soluble in that dispersing vehicle, and
  (j) optionally other adjuvants The invention also includes products of all the above processes.

DETAILED DESCRIPTION

Figure 1:
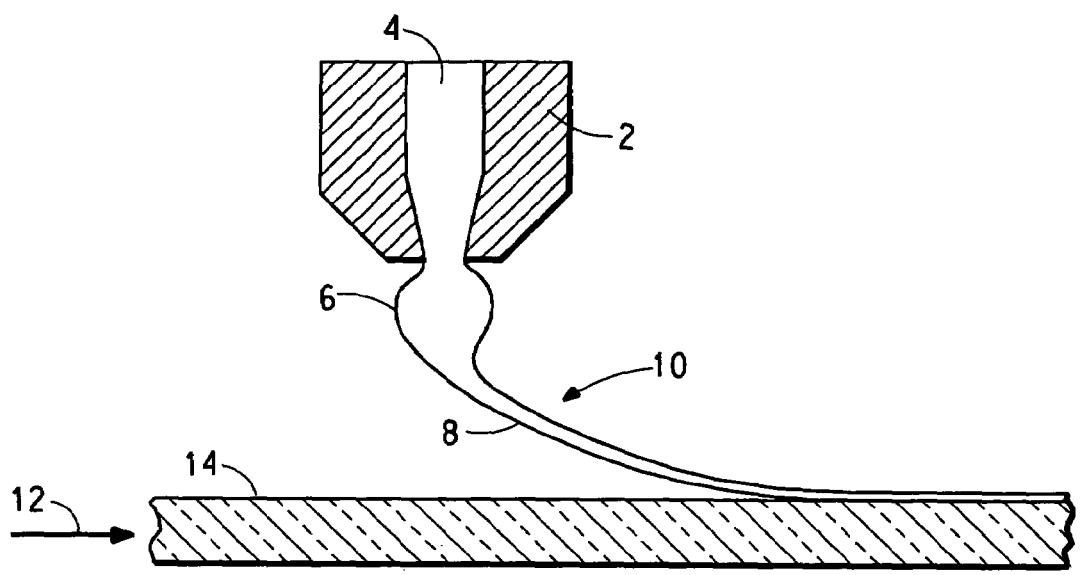
FIG. 1 shows a spun fiber being deposited on a rigid substrate.

The formulation described herein contains a relatively dilute, extensible solution of an ultrahigh molecular weight polymer. A low solution concentration of the ultrahigh molecular weight polymer in the dispersing vehicle is essential to the composition of this invention. The formulation also contains a material that will become a functional phase in an electronics or display application. Finally, the formulation may contain a variety of other materials that aid in the formulation of the composition, the printing of the composition, or the performance of the composition in the end use application. Lines of the functional phase are printed onto a substrate by means of a spin printing process, which consists of forcing the formulation through an orifice to form a continuous fiber that may or may not be stretched before being laid down onto the substrate surface. The dispersing vehicle is evaporated to form the line and the other components may or may not be burned out of the line.

Virtually any system in which an ultrahigh molecular weight polymer is soluble in a solvent will work, though some are more practical than others. The ultrahigh molecular weight polymer in solution imparts significant viscoelasticity to the solution, making the solution extensible even at very low concentrations of the polymer. Similar effects can be seen for more concentrated solutions of polymers, which are merely high but not ultrahigh molecular weight, but the high concentrations required put additional demands upon the system. In a polymeric fluid, which is viscoelastic, there are normal (elastic) forces generated during shear in addition to the viscous forces. Since normal-forces scale with weight average molecular weight (Mw) to the 7th power, versus viscous forces that scale to Mw to the 3.4 power, as the molecular weight of the polymer builds, the normal forces scale very quickly.

The term "ultrahigh molecular weight polymer", as used herein, generally refers to a polymer having a molecular weight over 1,000,000. The term may include a single homopolymer or copolymer or may include a mixture of homopolymers or copolymers. Polymers of adequate molecular weight include the family of drag reducing polymers. By "drag reducing polymer" is meant a polymer which reduces the frictional force between the polymer solution and an object moving with respect to that solution, such as the solution flowing through a pipe, or a fiber being pulled through the solution. Such polymers, their properties, and tests for drag reduction, are known in the art, see for instance J. W. Hoyt in H. Mark, et al. Ed., *Encyclopedia of Polymer Science and Engineering*, vol. 5, 3rd Ed., p. 129-151 (1986) which is hereby included by reference. As explained in this reference, the higher the molecular weight of the polymer, the more effective the polymer is as a drag reducer. Therefore, it is preferred if the (number average) molecular weight of the polymer is at least 500,000, more preferably at least 1,00,000, and especially preferably well over 1,000,000.

Another measure of the adequacy of the molecular weight of a polymer in solution is a phenomenon called "rod climbing" and the "Weissenberg effect" after K. Weissenberg (*Nature*, 159, 310, (1947)) who first analyzed the effect and proposed a mechanism. In "rod climbing" the vortex of a stirred liquid inverts such as to climb the rod of a conventional stirring apparatus. Such polymers, their properties, and tests for "rod-climbing," are known in the art; see for instance *Dynamics of Polymeric Liquids*. The phenomenon may be interpreted in a rather simple fashion with the notion of an extra tension along the streamlines. In the rod-climbing experiment the streamlines (the paths of imaginary particles in a fluid relative to the stirrer past which the fluid is moving in a smooth flow without turbulence) are closed circles and the extra tension along these lines "strangulates" the fluid and forces it inwards against the centrifugal force and upwards against the gravitational forces. The extra tension along the streamlines comes from the normal forces exhibited by polymeric solutions. In a Newtonian fluid under shear, there are only viscous dissipation forces. In a polymeric fluid, which is viscoelastic, there are normal (elastic) forces generated during shear in addition to the viscous forces. Scaling of the normal-forces with seventh power of weight average molecular weight (Mw) rapidly overwhelms the shear force, leading to rod climbing.

The unique physical properties of solutions of ultrahigh molecular weight polymers have been recognized for some time. They are often used as drag reducers in turbulent flow systems. Injecting only 10-50 ppm stock solution of a polymer additive can produce a drag reduction of more than 50%, implying that the energy cost necessary to transport the fluid is reduced by the same amount. It is generally accepted that both the highly viscoelastic behavior and energy dissipation phenomena of polymer solutions and the interaction between polymer molecules and turbulence generate the drag reduction phenomenon. It is this high viscoelasticity of the dilute polymer solution that allows the process of spin printing in the current invention to occur. Thus, polymer systems that are effective in drag reduction will be effective in spin printing. It is anticipated that any polymer capable of drag reduction at part per million concentrations will be effective in spin printing at concentrations of a few percent. However, the sets of solvent and polymers that display this effect to date are limited.

Effective polymeric drag reducer additives are generally flexible, linear macromolecules with an ultrahigh molecular weight (H. J. Choi and M. S. Jhon, 1996, *Ind. Eng. Chem. Res.* 35, 2993-2998.). Examples are poly(ethylene oxide) (PEO) (C. A. Kim, J. H. Sung, H. J. Choi, C. B. Kim, W. Chun and M. S. Jhon, 1999, *J. Chem. Eng. Japan* 32, 803-811.), poly(acrylamide) (PMM)(T. Rho, J. Park, C. Kim, H. K. Yoon and H. S. Suh, 1996, *Polym. Degrad. Stab.* 51, 287-293) and polyisobutylene (PIB)(H. J. Choi and M. S. Jhon, 1996, *Ind. Eng. Chem. Res.* 35, 2993-2998). Double-stranded lambda DNA is a better drag reducer when compared with the linear polymers (H. J. Choi, S. T. Lim, P. Y. Lai and C. K. Chan, 2002, *Phys. Rev. Lett.* 89, art. no. 088302). Cationic surfactant systems (K. Sung, M. S. Han and C. Kim, 2003, *Korea-Australia Rheol. J.* 15, 151-156) are effective and are resistant to degradation in turbulent flow. Hydrophobically modified hydroxylethyl cellulose is effective in the presence of surfactants (V. Tirtaatmadja, J. J. Copper-White and S. J. Gason, 2002, *Korea-Australia Rheol. J.* 14, 189-201).

Industrial applications of drag reduction can be found in areas such as transport of crude oil (E. D. Burger, L. G. Chorn and T. K. Perkins, 1980, *J. Rheol.* 24, 603-626.), closed-circuit pumping installations such as central-heating systems and fire-fighting to increase the range of water jets, and water supply and irrigation systems (R. H. Sellin, J. W. Hoyt and O. Scrivener, 1982, *J. Hydraulic. Res.* 20, 29-68), sewage systems to prevent over-flowing after heavy rain (R. H. Sellin and M. Ollis, 1980, *J. Rheol.* 24, 667-684).

More relevant to this application, drag reducers have been employed in the hydraulic transport of solid particle suspensions (J. Golda, 1986, Hydraulic transport of coal in pipes with drag reducing additives, *Chem. Eng. Commun.* 43, 53-67) but coal is well outside the scope of this application.

Useful polymers for aqueous solutions include, but are not limited to poly (ethylene oxide), poly(acrylamide), xanthans and guar gum. Materials that are especially suitable for spin printing in an aqueous system appear to fall in certain specific categories. They are viscoelastic polymers having the following characteristics: a high polarity, water solubility, high molecular weight and a high hydrogen bond forming capability. Also, significantly they are very long or ultrahigh molecular weight, having a high linearity with few side branches and thereby an extremely large length to diameter ratio of the molecules. Solubility and high molecular weight are also important for effective dissolution of the ultrahigh molecular weight polymer in the water to achieve the desired properties. Some materials that work well are Guar Gum, Locust bean Gum, carrageenan or Irish moss, Gum Karaya, hydroxyethyl cellulose, sodium carboxymethylcellulose, DAPS 10 [acrylamide-3-(2-acrylamido-2-methylpropyl) dimethylammonio)-1-propanesulfonate copolymer], polyethylene oxide, polyacryamide and polyvinylpyrrolidone. These materials are exemplary of substances exhibiting the above characteristics and thus work well in spin printing. Poly(ethylene oxide) and poly(acrylamide) are preferred polymers, and poly(ethylene oxide) is especially preferred. Included in the term poly(ethylene oxide) are both homo- and copolymers of ethylene oxide. Similarly, the term poly(acrylamide) is meant to include homopolymers of acrylamide as well as its copolymers with monomers such as acrylic acid or N-alkylacrylamides.

The concentration by weight of the polymer in the formulated composition is about 0.1-8%, preferably about 0.5-5%, and more preferably about 1-2%. The optimum concentration will depend on many factors such as the molecular weight of the polymer being used and its chemical structure. Generally speaking, the higher the molecular weight of the polymer, the lower the concentration that will be needed in the extensible viscoelastic solution. Some polymers for the extensible solutions, particularly natural polymers, may have some fraction that is insoluble in water. This insoluble fraction should preferably be removed, as by filtration of the solution but care must be taken to avoid reduction of the molecular weight of the polymer in solution.

Useful polymers for hydrocarbon solutions include, but are not limited to poly(alpha-olefins) where the olefins contain eight or more carbon atoms. For instance, polyoctene, polydecene, polydodecene, polytetradecene, polyhexadecene, polyoctadecene, polyeicosene, and higher, and copolymers of mixed alpha-olefins such as polyhexene/codecene, polypentene/cohexadecene, polyhexene/cooctenne/codecene, and related copolymers, have been produced using traditional Ziegler Natta catalysts and employed in oil pipelines such as the Trans-Alaska Pipeline to reduce drag resulting from turbulence and increase the apparent carrying capacity of the pipeline. These polymers dissolved in hexane, octane, methylcyclohexane, decane, decaline, petroleum ethers, purified kerosenes, Exxon's Isopar® high purity isoparaffinic solvents, or other hydrocarbon solvents are suitable non-aqueous systems for spin printing. They can be quite effective in use, but in practical terms, may suffer from the flammability of the solvent.

Poly(methyl methacrylate) (PMMA) and related acrylic polymers, when of sufficient molecular weight, are useful in solvents such as pyridine, butyl acetate, butyl cellosolve acetate; carbitol esters, such as butyl carbitol, butyl carbitol acetate and carbitol acetate, TEXANOLB (2,2,4-trimethyl-1,3-pentanediol monoisobutyrate) and other appropriate polar and generally, ester solvents. Poly(methyl methacrylate) is not particularly useful in for instance, toluene. Poly(n-alkyl methacrylates) and n-alkyl acrylates can be useful polymers in hydrocarbon solvents when the alkyl branch on the ester group is of sufficient length to impart solubility in hydrocarbon solvents.

If polymers such as polyesters or nylons are to be employed, solvents such as hexafluoroisopropanol, phenol, catechols or formic acid must be employed. These solvents are toxic and noxious, limiting their applicability and thereby the applicability of the polymers they dissolve in spin printing. The ultra-high molecular weight PET utilized in the process of this invention can be made utilizing the procedure described by Rinehart in U.S. Pat. No. 4,755,587 or the process described by Cohn in U.S. Pat. No. 4,792,573. In the spin printing process of this invention, a solution of PET in an appropriate organic solvent is prepared with the PET essentially homogeneously dispersed throughout the solvent. The organic solvents which can be utilized for PET are selected from the group consisting of (a) hexafluoroisopropanol, (b) trifluoroacetic acid, (c) mixed solvent systems containing hexafluoroisopropanol and dichloromethane, and (d) mixed solvent systems containing trifluoroacetic acid and dichloromethane. The mixed solvent systems of hexafluoroisopropanol and dichloromethane will typically contain from about 20 weight percent to about 99 weight percent hexafluoroisopropanol and from about 1 weight percent to about 80 weight percent dichloromethane. Such hexafluoroisopropanol/dichloromethane mixed solvent systems will preferably contain from about 30 weight percent to about 99 weight percent hexafluoroisopropanol and from about 1 weight percent to about 70 weight percent dichloromethane. The mixed solvent systems containing trifluoroacetic acid and dichloromethane will typically contain from about 20 weight percent to about 99 weight percent trifluoroacetic acid and from about 1 weight percent to about 80 weight percent dichloromethane.

The term "dispersing vehicle", as used herein, refers to fluids that are solvents or mixtures of solvents for the ultrahigh molecular weight polymer and will disperse the active component particles. Solvents may be pure chemicals or mixtures of chemicals. For instance, it may be useful to combine water with an alcohol or glycol to modify the rate of evaporation of the overall solvent mixture. Similarly, butyl acetate solvent may be used in conjunction with 2,2,4-trimethyl-1,3-pentanediol monoisobutyrate to modify the rate of evaporation.

The terms "viscoelastic polymer solution" or "viscoelastic solution", as used herein refer to a solution of an ultrahigh molecular weight polymer exhibiting both viscous and elastic properties. A viscoelastic liquid will readily deform and flow under the influence of an applied shear stress. When the stress is removed the liquid will quickly recover from the last small portion of the deformation. Thus a small fiber quickly being drawn from a mass of the viscoelastic solution will remain straight while under tension, but will visibly sag immediately under the lesser force of the weight of gravity when the drawing tension is removed. For the purpose of this invention, any polymer solution having less than 10% concentration by weight of ultrahigh molecular weight polymer that may be extruded from a 125 μm orifice at a rate greater than 20 m/min and extended to greater than 40 m/min for 1 min or longer without breaking will be considered to be a "viscoelastic polymer solution." Example 4 demonstrates actual tests of polymer solutions and the results of those tests.

The term "functional phase particles" as used herein refers to materials that impart conductive, resistive, emissive, phosphorescent, barrier, insulator, or dielectric properties to the composition. The "functional phase particles" may also impart UV or visible absorption to the composition or may act as photoactive species such as photocatalysts. It is generally desired that the functional phase particles contained herein are spherical or close to spherical in shape, but in contrast to ink-jet printing systems, acicular materials can be accommodated. Components of the composition are described herein below. The term "functional phase particles" as used herein does not refer to materials designed to impart improved strength or stability to the ultrahigh molecular weight fraction of the composition.

The concentration by weight of the functional phase particles in the formulated composition is about 0.1-70%, preferably about 0.5-50%, and more preferably about 1-30%. The optimum concentration will depend on many factors that include the density of the functional phase, the ability to disperse the material in the overall composition, the dimensions of the resulting desired images. The ability to disperse the material is dependent upon a variety of factors including the particle size of the material, the surface energy of the material, any surface treatments of the material, the efficacy of energy input in the dispersion process, to name a few.

In conductor applications the functional phase is comprised of electrically functional conductor powder(s). The electrically functional powders in a given composition may comprise a single type of powder, mixtures of powders, alloys or compounds of several elements. Examples of such powders include: gold, silver, copper, nickel, aluminum, platinum, palladium, molybdenum, tungsten, tantalum, tin, indium, lanthanum, gadolinium, ruthenium, cobalt, titanium, yttrium, europium, gallium, zinc, silicon, magnesium, barium, cerium, strontium, lead, antimony, conductive carbon, and combinations thereof and others common in the art of thick film compositions. In systems to be fired at elevated temperatures, silver oxide may be employed because it autoreduces to silver metal under firing conditions.

In resistor compositions, the functional phase is generally a conductive oxide. Examples of the functional phase in resistor compositions are Pd/Ag and $RuO_2$. Other examples include ruthenium pyrochlore oxide, which is a multi-component compound of $Ru^{+4}$, $Ir^{+4}$ or a mixture of these (MI'), said compound being expressed by the following general formula:

$$M_xBi_{2-x}(M'_yM''_{2-y})O_{7-z}$$

wherein: M is selected from the group consisting of yttrium, thallium, indium, cadmium, lead, copper and rare earth metals; M' is selected from the group consisting of platinum, titanium, chromium, rhodium and antimony; M" is ruthenium, iridium or a mixture thereof; x denotes 0 to 2 with a proviso that x≦1 for monovalent copper; y denotes 0 to 0.5 with the proviso that when M' is rhodium or two or more of platinum, titanium, chromium, rhodium and antimony, y stands for 0 to 1; and z denotes 0 to 1 with a proviso that when M is divalent lead or cadmium, z is at least equal to about x/2. These ruthenium pyrochlore oxides are described in detail in the specification of U.S. Pat. No. 3,583,931. The preferred ruthenium pyrochlore oxides are bismuth ruthenate ($Bi_2Ru_2O_7$) and lead ruthenate ($Pb_2Ru_2O_6$).

In dielectric compositions, the functional phase is generally a glass or ceramic. Dielectric thick film compositions are nonconducting compositions or insulator compositions that separate electrical charges and may result in the storage of an electrical charge. Therefore, the thick film dielectric compositions typically contain ceramic powders, oxide and non-oxide frits, crystallization initiator or inhibitor, surfactants, colorants, organic mediums, and other components common in the art of such thick film dielectric compositions. Examples of ceramic solids include: alumina, titanates, zirconates and stannates, $BaTiO_3$, $CaTiO_3$, $SrTiO_3$, $PbTiO_3$, $CaZrO_3$, $BaZrO_3$, $CaSnO_3$, $BaSnO_3$ and $Al_2O_3$, glass and glass-ceramic. It is also applicable to precursors of such materials, i.e., solid materials, which upon firing are converted to dielectric solids, and to mixtures thereof.

In barrier or insulator compositions, the functional phase is generally a glassy or ceramic metal oxide. Examples are powder of borosilicate lead glass, borosilicate zinc glass or borosilicate bismuth glass (i.e., $PbO$—$SiO_4$ glass, $PbO$—$B_2O_3$—$SiO_4$ glass, $ZnO$—$SiO_4$ glass, $ZnO$—$B_2O_3$—$SiO_4$, glass, $BiOSiO_4$ glass, and $BiO$—$B_2O_3$—$SiO_4$ glass); powdered oxides of Na, K, Mg, Ca, Ba, Ti, Zr, Al, etc., such as cobalt oxide, iron oxide, chromium oxide, nickel oxide, copper oxide, manganese oxide, neodymium oxide, vanadium oxide, cerium oxide, titanium dioxide (Tipaque Yellow), cadmium oxide, ruthenium oxide, silica, magnesia, and spinel;

The inorganic, insulating or dielectric powder may be a mixture of particles different in physical properties. For example, a combined use of glass particles or ceramic particles having different thermal softening points is effective to control the shrinkage on baking. The shapes and the physical properties of inorganic powders are combined appropriately according to the characteristics required of the components such as barrier ribs, etc.

In emissive compositions, the functional field emitting phase may be single or multiple wall carbon nanotubes. Metal oxide electron-emitting material often contain a first component, M', selected from the group consisting of barium, strontium, calcium and mixtures thereof, and a second component, M", selected from the group consisting of tantalum, zirconium, niobium, titanium, hafnium and mixtures thereof, as metal element components and also contains oxynitride perovskite. The electron-emitting material may also contain $M'M''O_4N$ type crystals as the oxynitride perovskite wherein M' denotes the first component and M" denotes the second component. Preferably, the electron-emitting material satisfies the relationship: wherein X and Y are molar ratios of the first and second components to the total of the first and second components, respectively. In the electron-emitting material, the second component may be partially present in the form of a carbide or nitride or both. Preferably, the electron-emitting material further contains as an additional metal element component at least one element M which is selected from the group consisting of Mg, Sc, Y, La, V, Cr, Mo, W, Fe, Ni, and Al, more preferably in an amount of more than 0 mass % to 10 mass % calculated as oxide. The electron-emitting material may further contain at least one oxide selected from among $M'_4M''_2O_9$, $M'M''_2O_6$, $M'M''O_3$, $M'_5M''_4O_{15}$, $M'_7M''_6O_{22}$, and $M'_6M''M''_4O_{18}$ type crystals wherein M' and M" are as defined above. The electron-emitting material preferably has a resistivity of $10^{-6}$ to $10^3$ ohm m at room temperature. The electrode is typically used as an electrode in a discharge lamp, electron gun, gas discharge panel, or field emission display.

Electroluminescent phosphor particles are useful in the manufacture of displays. They may be selected for example from $MGa_2S_4$, $ZnGa_2O_4$, $MGa_2O_4$, $Ga_2O_3$, $Ca_3Ga_2O_6$, and $Zn_2(Ge,Si)O_4$ (M=Ca and/or Sr), ZnS or M'S (M'=Ba, Ca, and/or Sr). Also included would be $Y_2O_2S$, ZnS, $ZnSiO_4$, or $Y_2SiO_5$ The "functional phase particles" also includes "precursor compositions" or may be formed in situ from "precursor compositions." Such an approach has been described in detail in the international application, WO 03/032084 that is incorporated herein by reference in its entirety. The precursor compositions preferably have chemical reactivity that allows them to be decomposed, reduced, oxidized, hydrolyzed or otherwise converted into "functional phase" under relatively mild conditions. For instance, conductive functional phases could be formed by the low temperature decomposition of organometallic precursors, thereby enabling the formation of electronic feature on a variety of substrates, including organic substrates. The precursor compositions to conductive systems can include various combinations of molecular metal precursors, solvents, micron-sized particles, nanoparticles, vehicles, reducing agents and other additives. The precursor compositions can advantageously include one or more conversion reaction inducing agents adapted to reduce the conversion temperature of the precursor composition. The conductive precursor compositions can be deposited onto a substrate and reacted to form highly conductive electronic features having good electrical and mechanical properties. The conductive precursor compositions according to the present invention can be formulated to have a wide range of properties and a wide range of relative cost. For example, in high volume applications that do not require well-controlled properties, inexpensive conductive precursor compositions can be deposited on cellulose-based materials, such as paper, to form simple disposable circuits. Ceramic precursor compositions could be formulated in non-aqueous solvent systems from metal alkoxides that would undergo subsequent hydrolytic transformations upon exposure to water or atmospheric moisture.

The electrically functional powders described above are finely dispersed in an organic medium and are optionally accompanied by inorganic binders. The term "inorganic binders" as used herein refers to materials that cause the functional phase materials to perform better in the end-use application. Inorganic binders frequently cause the functional material to bind more securely to the substrate. Alternatively, they may reduce the surface tension of the functional phase materials to improve continuity in the printed pattern. These may be metal oxides, ceramics, and fillers, such as other powders or solids. These materials may be identical in composition to some of the active components in other applications, but when used as a binder, they are generally present in lower concentrations in the overall composition. The function of an inorganic binder in a composition is binding the particles to one another and to the substrate after firing. Examples of inorganic binders include glass binders (frits), metal oxides and ceramics. Glass binders useful in the composition are conventional in the art. Some examples include borosilicate and aluminosilicate glasses. Examples further include combinations of oxides, such as: $B_2O_3$, $SiO_2$, $Al_2O_3$, CdO, CaO, BaO, ZnO, $SiO_2$, $Na_2O$, $Li_2O$, PbO, and ZrO which may be used independently or in combination to form glass binders. Typical metal oxides useful in thick film compositions are conventional in the art and can be, for example, ZnO, MgO, CoO, NiO, FeO, MnO and mixtures thereof.

The glass frits most preferably used are the borosilicate frits, such as lead borosilicate frit, bismuth, cadmium, barium, calcium, or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compounds that will yield the desired oxides under the usual conditions of frit production. For example, boric oxide will be obtained from boric acid, silicon dioxide will be produced from flint, barium oxide will be produced from barium carbonate, etc. The glass is preferably milled in a ball mill with water to reduce the particle size of the frit and to obtain a frit of substantially uniform size. It is then settled in water to separate fines and the supernatant fluid containing the fines is removed. Other methods of classification may be used as well.

The glasses are prepared by conventional glassmaking techniques, by mixing the desired components in the desired proportions and heating the mixture to form a melt. As is well known in the art, heating is conducted to a peak temperature and for a time such that the melt becomes entirely liquid and homogeneous. The glass transition temperature is in the range of 325 to 600° C.

It is preferred that at least 85% the inorganic binder particles be in the range of 0.1-10 µm and more preferably in the range of 0.2-2 µm. The reason for this is that smaller particles having a high surface area tend to adsorb the organic materials and thus impede clean decomposition. On the other hand, larger size particles tend to have poorer sintering characteristics. It is preferred that the weight ratio of inorganic binder to total solids be in the range 0.02 to 5 and more preferably in the range 0.1 to 2 and all ranges contained therein.

The binder materials may or may not be present in the formulations of other active components in compositions for resistive, emissive, phosphorescent, barrier, insulator, or dielectric applications.

Some or all of the solid-state inorganic binder or frit may be replaced with metal resinates and as used herein, the term inorganic binders is meant to include metal resinates. As used herein, the term "metal resinate" refers to organic metallic compounds which upon firing will be converted to inorganic oxides or glasses playing a role similar to the glass frit inorganic binders. The resinates are soluble or dispersible in the solvent used in the spin printing system. Common metallic soaps available on the market may be used as organic acid salts of base metals. Metals available for organic acid salts include such precious metals as Au, Ag, Pt, Rh, Ru and Pd. Available organic acid salts of base metals include Na, Mg, Al, Si, K, Ca, Ti, V, Cr, Mn, Fe, Co, Ni, Cu, Zn, Sr, Zr, Nb, MO, Cd, In, Sn, Sb, Cs, Ba, Ta, Pb and Bi. An appropriate material can be selected from the foregoing materials according to the properties required of the conductive paste. Another type of metal resinate is a chelate-type compound such as an organotitanate.

Metal resinates may range from highly fluid to very viscous liquids and to solids as well. From the standpoint of use in the invention, the solubility or dispersibility of the resinates in the medium is of primary importance. Typically, metal resinates are soluble in organic solvents, particularly polar solvents such as toluene, methylene chloride, benzyl acetate, and the like.

Suitable organotitanates are those disclosed in U.K. Pat. No. 772,675 and particularly those in which the organotitanates are hydrolyzable metal alcoholates of titanium corresponding to the formula $(AO)_{4x}.2yTiO$, in which A is C1-8 alkyl and C1-8 acyl, O is an oxygen atom covalently bonding two titanium atoms, x is an integer from 1 to 12 and y is 0 or an integer from 1 to 3x/2. The alkyl groups may be either straight chained or branched. Preferred organotitanates include titanium acetyl acetonate and tetraoctylene glycol titanium chelate. Other organotitanates of this titanium corresponding to the formula $(AO)_{4x}.2yTiO$, in type are disclosed in Ken-React Bul. No. KR-0278-7 Rev. (Kenrich Petrochemicals, Inc., Bayonne, N.J.) and which A is C1-8 alkyl or a mixture of C1-8 alkyl and C1-8 in Du Pont Bul. No. E-38961 entitled Versatile Tyzor Organic Titanates.

The "functional phase particles" are preferably nanoparticles. Nanoparticles have an average size of not greater than about 100 nanometers, such as from about 10 to 80 nanometers. Particularly preferred for compositions are nanoparticles having an average size in the range of from about 25 to 75 nanometers.

Nanoparticles that are particularly preferred for use in the present invention are not substantially agglomerated. Preferred nanoparticle compositions include $Al_2O_3$, $CuO_x$, $SiO_2$ and $TiO_2$, conductive metal oxides such as $In_2O_3$, indium-tin oxide (ITO) and antimony-tin oxide (ATO), silver, palladium, copper, gold, platinum and nickel. Other useful nanoparticles of metal oxides include pyrogenous silica such as HS-5 or M5 or others (Cabot Corp., Boston, Mass.) and AEROSIL 200 or others (Degussa A G, Dusseldorf, Germany) or surface modified silica such as TS530 or TS720 (Cabot Corp., Boston, Mass.) and AEROSIL 380 (Degussa A G, Dusseldorf, Germany). In one embodiment of the present invention, the nanoparticles are composed of the same metal that is contained in the metal precursor compound, discussed below. Nanoparticles can be fabricated using a number of methods and one preferred method, referred to as the Polyol process, is disclosed in U.S. Pat. No. 4,539,041 by Figlarz et al., which is incorporated herein by reference in its entirety.

The "functional phase particles" according to the present invention can also include micron-size particles, having an average size of at least about 0.1 µm. Preferred compositions of micron-size particles are similar to the compositions described above with respect to nanoparticles. The particles are preferably spherical, such as those produced by spray pyrolysis. Particles in the form of flakes increase the viscosity of the precursor composition and are not amenable to deposition using tools having a restricted orifice size, such as an ink-jet device. When substantially spherical particles are described herein, the particle size refers to the particle diameter. In one preferred embodiment, the low viscosity precursor compositions according to the present invention do not include any particles in the form of flakes.

It is known that micron-size particles and nanoparticles often form soft agglomerates as a result of their relatively high surface energies, as compared to larger particles. It is also known that such soft agglomerates may be dispersed easily by treatments such as exposure to ultrasound in a liquid medium, sieving, high shear mixing and 3-roll milling.

As used herein, the term "dispersing vehicle" is a fluid whose main purpose is to serve as a vehicle for dispersion of the finely divided solids of the active component of the composition in such form that it can readily be applied to a ceramic or other substrate. The solvent components of the dispersing vehicle should be inert (non-reactive) towards the other components of the composition. The dispersing vehicle must also be a solvent for the ultrahigh molecular weight polymer. Thus, the dispersing vehicle must first be one in which the solids are dispersible with an adequate degree of stability. Secondly, the rheological properties of the organic medium must be such that they lend good application properties to the dispersion.

The solvent(s) should have sufficiently high volatility to enable the solvent to be evaporated from the dispersion by the application of relatively low levels of heat at atmospheric pressure; however, the solvent should not be so volatile that the ink rapidly dries at normal room temperatures, during the spin-printing process. The preferred solvents for use in the compositions should have boiling points at atmospheric pressure of less than 300° C. and preferably less than 250° C. For more polar polymer systems, such solvents include water, aliphatic alcohols, esters of such alcohols, for example, acetates and propionates; terpenes such as pine oil and alpha- or beta-terpineol, or mixtures thereof; ethylene glycol and esters thereof, such as ethylene glycol monobutyl ether and butyl cellosolve acetate; carbitol esters, such as butyl carbitol, butyl carbitol acetate and carbitol acetate and other appropriate solvents such as TEXANOLB (2,2,4-trimethyl-, 3-pentanediol monoisobutyrate).

For non-polar polymer systems such as poly(alpha-olefins), the solvents will be non-polar systems such as alkanes; examples of useful systems include hexane, cyclohexane, methylcyclohecanes, octane, decane, Isopar® alkanes, petroleum ethers, purified kerosenes, terpenes and long-chain alkylethers. Aromatic solvents generally do not work well with poly(alpha-olefins) unless high operating temperatures are employed or there is some aromatic content in the polymer (See, for instance, U.S. Pat. No. 6,576,732). Solvents for crystalline polymer such as poly(ethylene terephthalate) or nylons will be highly polar hydrogen bonding solvents such as hexafluoroisopropanol, phenol, catechols, or formic acid.

As discussed above, the primary solvents used in these systems must be chosen in tandem with the ultrahigh molecular weight polymer. Water is the most common vehicle employed in these systems because it is compatible with many of the polymers and it is non-flammable as opposed to the solvents for the polyolefin systems. Water is commonly used in combination with a variety of hydrophilic organic molecules to modify the rate of evaporation, the wetting of the substrate, the compatibility with other additives and water as used herein is meant to imply systems in which the major component of the dispersing vehicle is water.

The ability to utilize mixtures of solvents with this invention provides considerable process advantages through operating latitude. Multiple solvents chosen to have specific evaporation or volatilization profiles can be critical in the development of uniform lines and edges, and in assuring adhesion of the printing ink to the substrate surface. In a preferred process of this invention, the primary solvent is water used in combination with other organic solvents having varied volatilities.

The vapor pressure of the organic molecules present in the dispersing vehicle should be sufficiently low that it does not rapidly evaporate from the paste at room temperature. This is to avoid reducing the "working life" of the spin printing ink. Additionally, if the vapor pressure is too high, it may vaporize during heat treatment too rapidly, which may produce an image containing excessive voids. The vapor pressure should be high enough to completely vaporize from the paste within a commercially practical time during heat treatment. The vapor pressure will therefore, at least in part, depend on the conditions of heat treatment.

B. Adjuvants

As used herein, the term "adjuvants" refers to a variety of additives whose purpose is to improve the performance of the process or system. For instance, polymeric dispersants and binders are important to the compositions of this invention and they are generally present in the composition at concentrations equal to or higher than those of the ultrahigh molecular weight polymers. As a result of their low molecular weight, in general, they contribute little to the viscoelastic properties of the system. They play a different role in that they help in the dispersion of the inorganic phases in the medium and help maintain the suspensions once dispersion is achieved. They must be compatible with the dispersing vehicle being employed and generally have a high affinity for or solubility in that solvent.

Water-based pigment dispersions are well known in the art, and have been used commercially for applying films such as paints or inks to various substrates. The pigment dispersion is generally stabilized by either a non-ionic or ionic technique. When using the non-ionic technique, the pigment particles are stabilized by a polymer that has a water-soluble, hydrophilic section that extends into the water and provides entropic or steric stabilization. Representative polymers useful for this purpose include polyvinyl alcohol, cellulosics, ethylene oxide modified phenols, and ethylene oxide/propylene oxide polymers. In aqueous systems, homopolymers, random copolymers and block copolymers of vinylpyrrolidone are particularly useful. The non-ionic technique is not sensitive to pH changes or ionic contamination. In many applications, it has a major disadvantage in that the final product is water sensitive. Thus, if used in ink applications or the like, the pigment will tend to smear upon exposure to moisture. In many of the applications involving the printing of ultra-fine active components discussed herein, this water sensitivity is not an issue in that the organic components will be removed by firing leaving the ultrafine active component behind.

In the ionic technique, the pigments or ultrafine particles are stabilized by a polymer of an ion containing monomer, such as neutralized acrylic, maleic, or vinyl sulfonic acid. The polymer provides stabilization through a charged double layer mechanism whereby ionic repulsion hinders the particles from flocculating. Since the neutralizing component tends to evaporate after application, the polymer then has reduced water solubility and the final product is not water sensitive. Unfortunately, in most cases the ionic stabilizers will leave behind an inorganic residue of the counterion upon firing. In the case of ammonium, phosphonium or related ionic stabilizers, this residue can be mitigated. In certain circumstances, the counterions can even serve the role of inorganic binder. Thus it is a complex combination of variables that will influence the choice of dispersants.

The polymeric dispersants can also be binders after the solvent has evaporated, but binders may also be required, independently. There are two general classes of polymer binder that are commercially available polymers. They may be used independently or together in the formulations. First are binders made of copolymer, interpolymer or mixtures thereof made from (1) nonacidic comonomers comprising $C+_{10}$ alkyl methacrylate, $C_{1-10}$ alkyl acrylates, styrene, substituted styrene, or combinations thereof and (2) acidic comonomer comprising ethylenically unsaturated carboxylic acid containing moiety; the copolymer, interpolymer or mixture thereof having an acid content of at least 10 weight % of the total polymer weight; and having an average glass transition temperature (Tg) of 50-150° C. and weight average molecular weight in the range of 2,000-100,000 and all ranges contained therein.

The polymers formulated in the present invention function to impart significant viscoelasticity for spinning and to suspend the other ingredients in the solvent so that they can be conveniently spun and applied to the substrate. Furthermore, the solvent diffuses from the paste and vaporizes during heat treatment to provide a substantially liquid-free, active components in combination with the polymeric components.

Both the ultrahigh molecular weight polymers and the adjuvant polymers in the present invention should act as "fugitive polymers" in most applications. It is important that the polymeric components are eliminated during firing or heat treatment in such a way as to provide a final image that is substantially free of voids and defects. The polymers must be "fugitive polymers" that will undergo 98-100% burnout under the firing conditions. The polymer is referred to as a "fugitive polymer" because the polymer material can be burned out of the functional components at elevated temperatures prior to fusing or sintering of the functional components on the substrate. As opposed to the solvent components that are simply volatilized, the polymeric components generally must undergo decomposition or oxidation to be removed. Thus, an important factor in the choice of both the ultrahigh molecular weight components and the dispersant component is their thermal behavior as indicated by thermogravimetric analysis. In general, it is desired that the polymers leave behind no carbonaceous residue, thus aromatic polymer systems are generally not preferred. For example, binder materials containing a significant proportion of aromatic hydrocarbons, such as phenolic resin materials, can leave graphitic carbon particles during firing which can require significantly higher temperatures to completely remove. It is also desirable that the polymeric components do not melt or otherwise become fluid during the firing process so that there is no degradation of the printed image.

At times, the printed compositions are too soft or malleable for subsequent operating steps. Alternatively, they can soften or flow during early stages of the burnout process. It then becomes convenient to crosslink the polymers in place photochemically after printing. Additionally, it may be convenient to print more than the desired pattern, photopolymerize the bulk of the pattern and then wash off certain small portions. While this might be a less than 100% additive process, the flexibility gained may well offset the loss of a small portion of the active component.

As described in Glicksman and Santopietro, WO 03/034150 A1, photocrosslinkable polymer binders are made of copolymer, interpolymer or mixtures thereof, wherein each copolymer or interpolymer comprises (1) a nonacidic comonomer comprising an alkyl acrylate, alkyl methacrylate, styrene, substituted styrene or combinations thereof and; (2) an acidic comonomer comprising ethylenically unsaturated carboxylic acid containing moiety, wherein a portion of the carboxylic acid-containing moiety is reacted with a reactive molecule having a first and second functional unit, wherein the first functional unit is a vinyl group and the second functional unit is capable of forming a chemical bond by reaction with the carboxylic acid moiety. Examples of the vinyl group include, but are not limited to methacrylate and acrylate groups. Examples of the second functional unit include, but are not limited to epoxides, alcohols and amines.

The presence of the acidic comonomer components in the composition is important in this technique. The acidic functional group generates the ability to be developed in aqueous bases such as aqueous solutions of 0.4-2.0% sodium carbonate. Best development is obtained when acidic comonomers are present in concentrations between 10% and 30%. Because they are cleaner burning in low-oxygen atmospheres, methacrylic polymers are preferred over acrylic polymers.

In addition to the above copolymers, adding small amounts of other polymer binders is possible. Some examples include polyolefins such as polyethylene, polypropylene, polybutylene, polyisobutylene, and ethylene-propylene copolymers, polyvinyl alcohol polymers (PVA), polyvinyl pyrrolidone polymers (PVP), vinyl alcohol and vinyl pyrrolidone copolymers, as well as polyethers that are low alkylene oxide polymers such as polyethylene oxide can be cited.

The weight average molecular weight of the polymer binder is in the range of 2,000-100,000 and any ranges contained therein. The molecular weight of the polymer binder will depend on the application. Weights less than 10,000 are generally useful because they do not adversely affect the viscosity of the system. It is desired that the viscoelastic properties of the system be imparted mostly by the ultrahigh molecular weight polymer.

When the above composition is printed to form a dry image, it is preferable that the Tg (glass transition temperature) of the polymer binder is 50-150° C., and more preferably 50-100° C. The polymer is found in the composition in the range of 3-15 wt. % and any ranges contained therein based on total composition.

As used herein, the term "deposit composition" refers the composition of this invention when it has been or is about to be deposited on the surface of a substrate.

As used herein, the term "reservoir" refers to a portion of deposit composition deposited upon the surface of the substrate from which fibers can be drawn as a result of the high viscoelasticity of the composition. The reservoir will generally be deposited through a fine-tipped spinnerette or other device capable of deposition metered quantities of fluid on the surface. Fibers will then be drawn from that reservoir as shown in FIG. 9, a cartoon of one exemplification of the printing process based upon generating a reservoir on the surface of the substrate. In step A of FIG. 9, the surface is contacted with deposit composition from the orifice of a finely pointed spinnerette. In step B, the material from the reservoir is stretched with the finely pointed tip of the spinnerette with some additional material being drawn out of the tip of the spinnerette. In step C, the tip is brought back close to the surface to pin or adhere the fiber to the surface. Finally, in step D, the tip is withdrawn from the surface while withdrawing the deposit composition partially into the depositing orifice to break or interrupt the continuity of the stream of deposit composition. Alternatively, the reservoir may be deposited on the surface of the substrate from a depositing orifice such as a spinnerette and the drawing of a fiber from the reservoir may be accomplished with another finely pointed object such as a needle.

As used herein, the term "finely pointed object" is a spinnerette or needle or other mechanical object capable of contacting a reservoir of deposit composition on the surface of a substrate. The finely pointed object is adhered to the deposit composition through any a variety of means. It may be wetted by the deposit composition. If the finely pointed object is a spinnerette, the deposit composition may not wet the surface of the spinnerette, but may selectively adhere to the deposit composition contained within the hollow cylinder of the spinnerette. Finely pointed is meant to imply that the tip of the object is of dimensions equal to or smaller than the dimensions of the reservoir and in the order of the dimensions of the desired fiber to be drawn into a feature. It is observed that when the reservoir is touched by a needle that cannot supply additional deposit composition and then a fiber is drawn from that reservoir, the length of the resulting fiber is limited by several factors. The first is the quantity of material in the reservoir. Another is the amount of surface of the needle over which the deposit composition is adhered, thus controlling the diameter of the fiber that is drawn from the reservoir. The surface area of contact with the needle is controlled by the diameter of the needle, the curvature of the point of the needle and the depth to which the needle is penetrates the surface of the reservoir. Another factor is the ability of the deposit composition to wet the surface of the needle. The ability to wet the surface of the needle will once again control the diameter of the fiber that is initially drawn from the reservoir. The ability to wet the surface of the needle is a function of the materials included in the deposit composition and the materials of construction of the needle. Thus, the surface of a stainless steel needle might be unmodified or might be modified by silylation or with fluorocarbon materials to control the wetting interaction.

It is clear that the length of the fiber to be drawn would normally be limited by the amount of material contained in the reservoir on the surface of the substrate. When the finely pointed object is capable of delivering additional deposit composition during the drawing process, as in a spinnerette, the line may be extended.

Generally, the spin printing process, by the nature of spinning and drawing fibers, is best suited to printing long, straight, very uniform lines on a flat substrate. The process of introducing physical contact of the spinnerette with the substrate, thereby pinning the fiber to the substrate, allows the process to readily turn corners. Thus a right angle pattern could be printed by translating in the X direction over a sunstrate, touching the surface at a specified point and then translating in the Y direction.

Spin printing readily accommodates printing on flat surfaces. Convex surfaces are readily treated through three dimensional movement of the spinnerette with respect to the surface of the substrate. However, the process would not normally accommodate printing on concave surfaces because the linear drawing of the fiber would span gaps in the surface. The method of contacting the surface of the substrate to leave a reservoir at the point of contact facilitates the printing of concave three dimensional surfaces.

Other Optional Components.

i. Photohardenable Monomer

Photoimaging capability may be optionally added to the fiber system. Photoimageable compositions are particularly useful to harden the deposited fiber when the fiber will not be fired. This is particularly important when the present invention is used in conjunction with flexible, polymeric substrates that would not undergo a firing step. Conventional photohardenable methacrylate monomers may be used in the invention as described in Glicksman and Santopietro, WO 03/034150 A1. Depending on the application, it is not always necessary to include a monomer in the composition of the invention when using the photocrosslinkable polymer.

ii. Photoinitiation System.

Suitable photoinitiation systems are those, which generate free radicals upon exposure to actinic light at ambient temperature. A useful variety of them are described in Glicksman and Santopietro, WO 03/034150 A1.

iii. Plasticizers

Frequently the organic medium will also contain one or more plasticizers if additional image softness is needed. Such plasticizers help to assure good lamination to substrates and in photopolymerizable systems, enhance the developability of unexposed areas of the composition. However, the use of such materials should be minimized in order to reduce the amount of organic materials that must be removed when the images are fired. The choice of plasticizers is determined primarily by its compatibility with the chosen solvent and the polymer that must be modified. Solubility of the plasticizer in the primary solvent is not necessarily required as long as it remained well dispersed in the ink. Among the plasticizers, which have been used in various binder systems are diethyl phthalate, dibutyl phthalate, butyl benzyl phthalate, dibenzyl phthalate, alkyl phosphates, polyalkylene glycols, glycerol, poly (ethylene oxides), hydroxy ethylated alkyl phenol, tricresyl phosphate triethyleneglycol diacetate and polyester plasticizers.

iv. Photospeed Enhancer

A photospeed enhancer may added to the organic medium or directly added to the composition in those cases where some degree of photocuring is desired and are described in Glicksman and Santopietro, WO 03/034150 Al.

v. Additional Components

Additional components known to those skilled in the art may be present in the composition including dispersants, stabilizers, release, agents, dispersing agents, stripping agents, and antifoaming agents. A general disclosure of suitable materials is presented in U.S. Pat. No. 5,049,480.

The technique of the present invention may be applied to a wide variety of substrates. The types of substrates that are particularly useful include polyfluorinated compounds, polyimides, epoxies (including glass-filled epoxy), polycarbonates and many other polymers. Particularly useful substrates include cellulose-based materials such as wood or paper, acetate, polyester, polyethylene, polypropylene, polyvinyl chloride, acrylonitrile, butadiene (ABS), flexible fiber board, non-woven polymeric fabric, cloth, metallic foil, ceramics and glass. The substrate can be coated, for example a dielectric on a metallic foil or a metal on a ceramic or glass.

One difficulty in printing fine features is that the printed composition can wet the surface and rapidly spread to increase the width of the deposit, thereby negating the advantages of fine line printing. This is particularly true when printing is employed to deposit fine features such as interconnects or conductors for displays.

Spreading of the precursor composition is influenced by a number of factors. A drop of liquid placed onto a surface will either spread or not depending on the surface tensions of the liquid, the surface tension of the solid and the interfacial tension between the solid and the liquid. If the contact angle is greater than 90 degrees, the liquid is considered non-wetting and the liquid tends to bead or shrink away from the surface. For contact angles less than 90 degrees, the liquid can spread on the surface. For the liquid to completely wet, the contact angle must be zero. For spreading to occur, the surface tension of the liquid must be lower than the surface tension of the solid on which it resides.

The compositions can be confined on the substrate, thereby enabling the formation of features having a small minimum feature size, the minimum feature size being the smallest dimension in the x-y axis, such as the width of a conductive line. The composition can be confined to regions having a width of not greater than 100 µm, preferably not greater than 75 µm, more preferably not greater than 50 µm, and even more preferably not greater than 25 µm. The present invention provides compositions and methods of processing that advantageously reduce the spreading of the composition. For example, small amounts of rheology modifiers such as styrene allyl alcohol (SAA) and other polymers can be added to the precursor composition to reduce spreading. The spreading can also be controlled through combinations of nanoparticles and precursors. Spreading can also be controlled by rapidly drying the compositions during printing by irradiating the composition during deposition.

A preferred method is to pattern an otherwise wetting substrate with non-wetting enhancement agents that control the spreading. For example, this can be achieved by functionalizing the substrate surface with trialkylsilyl, hydrocarbyl or fluorocarbon groups.

Fabrication of conductor features with feature widths of not greater than 100 µm or features with minimum feature size of not greater than 100 µm from a composition requires the confinement of the low viscosity precursor compositions so that the composition does not spread over certain defined boundaries. Various methods can be used to confine the composition on a surface, including surface energy patterning by increasing or decreasing the hydrophobicity (surface energy) of the surface in selected regions corresponding to where it is desired to confine the precursor or eliminate the precursor. These can be classified as physical barriers, electrostatic and magnetic barriers, surface energy differences, and process related methods such as increasing the composition viscosity to reduce spreading, for example by freezing or drying the composition very rapidly once it strikes the surface.

A preferred method is to simultaneously print two immiscible compositions, one containing functional phase particles and the other without functional phase particles side by side on a substrate in such a manner that the composition without functional phase particles constrains the composition with functional phase particles to a specific surface area. The miscibility of the two compositions would be dictated largely by the dispersing vehicle. It is generally found that for ultrahigh molecular weight polymers, the solvent for a given polymer is limited, so it is likely that both the dispersing vehicle and the ultrahigh molecular weight polymer would be different to achieve immiscibility. Alternatively, the two compositions may both contain functional phase particles that are different. Such a procedure would result in one functional phase material being bound in position by the adjacency of the other.

A preferred method which is a variation of the immiscible composition approach is to print two miscible but differing compositions, one containing functional phase particles and the other without functional phase particles side by side on a substrate in such a manner that the composition without functional phase particles constrains the composition with functional phase particles to a specific surface area. The two dispersing vehicles in the two compositions my simply be miscible or they may be the same. While the miscibility of the two compositions would allow some mixing, the high solution viscosity of the ultrahigh molecular weight polymer causes the mixing or interpenetration of the two compositions to be minimal. As a result, diffusion of the functional phase particles is minimal. Alternatively, the two compositions may both contain functional phase particles that are different. Such a procedure would result in one functional phase material being bound in position by the other.

One embodiment of the invention provides a set of printing compositions designed to minimize the spreading of lines. The composition set comprises at least two compositions. The two dispersing vehicles and their respective ultrahigh molecular weight polymers may be chosen to be immiscible, thereby providing the maximum resistance to line spreading. Alternatively, the dispersing media may be miscible or may be the same, relying upon the high solution viscosity of the ultrahigh molecular weight polymer to minimize interpenetration of the two compositions.

Another example of a method for depositing the composition is to heat the composition relative to the temperature of the substrate to decrease the viscosity of the composition during printing. This can also have the advantage of volatilizing a portion of the dispersing vehicle before the composition reaches the substrate, thereby minimizing spreading of the line due to wetting of the surface.

Another example of a method for depositing the composition is using a heated substrate to increase the rate of volatilization of the dispersing vehicle. If the composition contains reactive species, the heated surface can cause the immediate reaction, thereby crosslinking or otherwise modifying the printed pattern.

Another example of a method for depositing the composition is using a chilled substrate to quickly increase the viscosity of the printed pattern to minimize spreading of the lines.

Another example of a method for depositing the composition is to employ an array of many spinnerettes. Thus, for example, to print 1000 parallel conductive silver lines on glass for a display, a spinning head containing 1000 spinnerettes would be used. Consecutive sheets of glass would be transported continuously beneath the spinning head to print all 1000 lines on each glass panel with no break in the silver-containing fiber. Alternatively, a single head could be transported repeatedly back and forth across a single sheet of glass printing all 1000 lines.

Another example of a method for depositing the composition is to employ the method of creating a reservoir and pulling fibers from that reservoir. Generally, a fiber being stretched will be essentially linear from the point from which it originated to the point at which the drawing force is being applied. Thus, curved patterns are difficult. However, the act of "pinning" the fiber to the substrate surface by touching it to that surface such that it adheres. The act of pinning allows the direction of draw to be changed to create, for example, a right angle in the resulting image. This process may be repeated as many times as necessary to create the desired image. Taken to an extreme, the spinnerette would be writing continuous curves on the surface of the substrate. In this case, there would be no draw of the fiber and the width of the resulting line would be determined by the diameter of the spinnerette. Thus the resolution of the lines would be severely limited.

The conductive feature can be post-treated after deposition and conversion of the metal precursor. For example, the crystallinity of the phases present can be increased, such as by laser processing. The post-treatment can also include cleaning and/or encapsulation of the electronic features, or other modifications.

Another method for depositing the composition is using multi-pass deposition to build the thickness of the deposit. In one embodiment, the average thickness of the deposited feature is greater than about 0.1 µm and even more preferably is greater than about 0.5 µm. The thickness can even be greater than about 1 µm, such as greater than about 5 µm. These thicknesses can be obtained by deposition of discrete units of material by depositing more than a single layer. A single layer can be deposited and dried, followed by repetitions of this cycle. Sequential layers of material do not have to be taken through sequential drying processes; additional depositions may be carried out before the previous layer is completely dry. The use of multiple layers can be employed to build up substantial channels or vias on the surface of a substrate to physically confine the composition.

Channels on the surface of a substrate may be filled via the method of this invention. The channels being filled may have been created by any of a number of processes. In this physical barrier approach, a confining structure is formed that keeps the composition from spreading. These confining structures may be trenches and cavities of various shapes and depths below a flat or curved surface, which confine the flow of the precursor composition. Such trenches can be formed by chemical etching or by photochemical means. The physical structure confining the precursor can also be formed by mechanical means including embossing a pattern into a softened surface or means of mechanical milling, grinding or scratching features. Trenches can also be formed thermally, for example by locally melting a low melting point coating such as a wax coating. Alternatively, retaining barriers and patches can be deposited to confine the flow of composition within a certain region. For example, a photoresist layer can be spin coated on a polymer substrate. Photolithography can be used to form trenches and other patterns in this photoresist layer. These patterns can be used to retain precursor that is deposited onto these preformed patterns. After drying, the photolithographic mask may or may not be removed with the appropriate solvents without removing the deposited metal. Retaining barriers can also be deposited with direct write deposition approaches such as ink-jet printing or any other direct writing approach as disclosed herein.

It will be appreciated from the foregoing discussion that the process is best designed for the printing of straight lines on a substrate. A process of line spreading upon contact with the substrate has been described. The width of line features is also a function of the width of the fiber being deposited upon the surface. The width of the line is a function of the size of the spinnerette, the pumping rate through the spinnerette, and the draw ratio of the fiber after it has left the spinnerette and before it has contacted the substrate surface. The draw ratio of the fiber is a function of the rate of translation of the spinnerette relative to the surface of the substrate. Relative translation of the spinnerette to the substrate can be accomplished by movement of either the substrate or the spinnerette. The width of a line may be modulated by modification of width of the fiber before contact with the substrate. Thus the width of a line may be modulated by changing the spinning rate or by changing the rate of relative translation of the spinnerette to the substrate.

The width of line features is also a function of the concentration of the dispersing vehicle at the moment of contact with the substrate surface. Thus, if there is evaporation of the dispersing vehicle from the fiber between the time that it exits the spinnerette and the time that it contacts the surface of the substrate, wetting of the surface and spreading of the line will reduced. This is particularly true as the diameter if the drawn fiber is reduced, thereby increasing the relative surface area of the fiber from which evaporation may occur. On the rapid time frame of the imaging process, evaporation will occur primarily from the surface of the fiber rather than uniformly throughout. This further contributes to minimization of spreading on the substrate surface.

It will be appreciated from the foregoing discussion that two or more of the latter process steps (drying, heating, reacting and sintering) can be combined into a single process step.

When forcing the composition through the spinnerette, a variety of methods may be employed. A positive displacement pump may be employed to maintain a constant flow rate. Syringe pumps are typically employed for this approach. Alternatively, the composition may be maintained at a constant positive pressure sufficient to force it through the spinnerette at the desired rate.

The electronics, display and energy industries rely on a variety of printing methods for the formation of coatings and patterns of conductive and other electronically active materials to form circuits on organic and inorganic substrates. The primary methods for generating these patterns are screen printing for features larger than about 100 μm and thin film and etching methods for features smaller than about 100 μm. Ink jet technology is beginning to be developed for printing find conductive features on electronic systems. Subtractive methods to attain fine feature sizes include the use of photo-patternable pastes and laser trimming. Each of these printing techniques together with the spin printing technique described in this document has a signature set of characteristics that allow devices made by one particular technique to be differentiated from those made by the others. Those features are detected by optical microscopy, electron microscopy, profilometry, and electrical measurements. For instance, photo-patternable pastes have relatively square shoulder features. Ink jetting results in relatively thin patterns or the presence of multiple passes can be detected microscopically. Laser trimming shows the effects of ablation along the sides of the features. Spin printing is characterized by good edge acuity and a rounded profile often thicker than can be achieved with ink jetting. These characteristics become apparent to one skilled in the art.

General Preparation of the Composition

Typically, aqueous-based spin printing ink compositions are formulated to have a jelly- or paste-like consistency. Generally, the inks are prepared by mixing the organic vehicle that is a non-solvent for the ultrahigh molecular weight polymer that is added in powder form, monomer(s), ultrahigh molecular weight polymer and other organic components in a mixing vessel. This mixing will be carried out under yellow light for photocurable systems. The ultrafine inorganic materials are then added to the mixture of organic components. The total composition is then mixed until the inorganic powders and ultrahigh molecular weight polymer is wetted by the organic materials. The mixture is then roll milled using a high-shear three-roll mill. The paste viscosity at this point could be adjusted with the appropriate vehicle or solvent to achieve a viscosity optimum for processing. Care is taken to avoid dirt contamination in the process of preparing paste compositions and in preparing parts, since such contamination can lead to defects. Finally, the water is added to the system, causing the ultrahigh molecular weight polymer to go into solution and achieving the desired jell-like consistency. The ink is then tumble-milled under low-shear conditions until it is thoroughly mixed.

Hydrocarbon-based systems will be prepared similarly, but the ultrahigh molecular weight polymers are not available in convenient powder forms. Thus the milling will be done in the primary solvent used for the system rather than in a non-solvent for the ultrahigh molecular weight polymer. Small particles of the ultrahigh molecular weight polymer are added to the system and the mixture is further mixed in a rubber mill for a short period of time while the polymer begins to swell. Mixing is completed in a tumble mill.

Conditions:

The temperature of the spin printing process is not critical but will be dependent upon the nature of the solvent being employed. For aqueous systems a temperature range of about 0° C. to about 80° C., preferably 30° C. to 60° C. is convenient. Obviously, higher temperatures will result in greater evaporation of the dispersing vehicle during the printing process.

The printing process is relatively unaffected by environmental conditions, though the movement of air between the point the fiber is spun and the fiber is laid onto the substrate should be minimized.

Relative humidity will affect the drying rate of the aqueous based systems and a lesser effect on the other solvent systems. This is generally reflected in the rate of drying of the polymer filament. If drying is too rapid, the fiber can be difficult to elongate prior to laying on the substrate. Drying too rapidly on the substrate can lead to distortions of the edge features of the lines. For these reasons, some control of relative humidity is preferred. It is also useful to utilize bi-component solvents to control the drying profile.

Substrates:

The substrates for this process can be rigid or flexible. Generally, it is desired that the substrates not be highly absorbent and the surface of the substrate must be clean, free from defects, and smooth.

Rigid substrates would encompass for example, glass, rigid crystalline or amorphous plastics, glass with various surface treatments, or various electrical components previously printed onto a rigid substrate. Rigid substrates are useful in display devices such as plasma display panels, or liquid crystal displays. Substrates such as crystalline and amorphous silicon for solar energy devices may be printed using the techniques reported herein.

Flexible or semiflexible substrates are useful in a number of manners. The substrates may include flexible plastics such as Mylar® poly(ethylene terephthalate), or other polyester films, Kapton® polyimide films, paper, surface-coated paper, polyethylene, polypropylene and biaxially-oriented polypropylene, or other natural and synthetic polymer systems. The printed flexible substrates can be or be incorporated into the final device. Alternatively, the image printed on the flexible substrate can be transferred onto the final device. Generally, patterns spin-printed onto flexible substrates cannot be fired at high temperatures due to the stability of the flexible substrate, but after transfer to or lamination on to rigid substrates, the system may be fired to achieve the final desired properties and to remove the flexible portion of the system.

Process Conditions:

Care was taken to avoid dirt contamination in the process of preparing paste compositions and in preparing parts, since such contamination can lead to defects. The parts were dried at 80° C. in an air atmosphere oven. The dried parts were then normally fired in an air atmosphere at peak temperatures of 520° C. or under.

General Firing Profile:

The composition of the present invention may be processed by using a firing profile. Firing profiles are well within the knowledge of those skilled in the art of thick film technology. Removal of the organic medium and sintering of the inorganic materials is dependent on the firing profile. The profile will determine if the medium is substantially removed from the finished article and if the inorganic materials are substantially sintered in the finished article. The term "substantially" as used herein means at least 95% removal of the medium and sintering the inorganic materials to a point to provide at least adequate resistivity or conductivity or dielectric properties for the intended use or application.

Systems for Lamination:

When the image is being made onto a flexible medium for subsequent lamination, the spin-printed image may be protected by lamination with a coversheet before it is wound as a widestock roll. Silicone coated terephthalate PET film, polypropylene, or polyethylene may be used as a coversheet. The coversheet is removed before laminating to the final substrate.

Spin-printing is accomplished by spinning the viscoelastic polymer solution containing the functional phase and other components through a die or spinnerette onto a substrate that is in motion relative to the spinnerette. The solution-spun filament is made by forcing the organic solvent containing the polymer and other ingredients through the orifice of the die. The orifice of the die will typically be round, but can also be of other desired geometries. Dies have orifices of varied shape can be utilized to produce filaments having a wide variety of cross sectional designs, for example, round, square, rectangular, or elliptical. For instance, a die having a rectangular orifice can be utilized to produce a filament that is essentially in the form of a ribbon or film. If the shape of the filament is other than round, the orientation of the die shape relative to the substrate can be adjusted as desired. For instance, a ribbon or rectangular shape can be placed on the substrate either vertically or horizontally, as desired. It is generally convenient to utilize a die having an orifice that is essentially circular. The orifice of such dies will typically have a diameter that is within the range of about 20 to about 400 microns. In most cases, it is preferred for such orifices to have a diameter that is within the range of about 30 microns to about 200 microns.

Spinnerets that are equipped with multiple orifices can be used to print multiple lines in a single pass. Spacing of the multiple holes can be regular to provide a regular array of lines or spaced in a particular pattern to give a particularly desired array of lines. Dies with multiple holes do not necessarily need to be placed perpendicularly to the direction being printed. A diagonal placement will allow lines to be printed with spacing more narrow than the spacing of holes in the die. Holes in the die which are aligned parallel to the printing direction would allow multiple thicknesses to be printed in a single pass or to have two or more different compositions printed one atop another in a single pass.

The polymer solution containing the functional phase and other ingredients is forced through the die at a rate that is sufficient to attain a spinning speed of about 1 meter per minute to about 1000 meters per minute. Typically, the spinning speed is between about 2 meters per minute to about 400 meters per minute. It is generally desirable to utilize the fastest possible spinning speed that retains satisfactory uniformity. However, it may also be convenient to utilize slower spin-printing speeds to match the speed of the printing process with the speed of subsequent, down-stream steps in the manufacturing process. Higher spinning speeds are also desirable because they result in higher throughputs and better productivity. For this reason, spinning speeds in excess of 400 meters per minute would be desirable if uniformity and other desired properties can be maintained. It is expected that the lower spin-printing speeds will be utilized on rigid substrates where the machine direction is not parallel to the spinning direction. A potential configuration where the fiber is deposited on a flat glass substrate is shown in FIG. 1. Gas flow may be utilized to lay the polymer onto the substrate. Areas where no printing is desired may be masked during the continuous printing process. In FIG. 1, the spinnerette is labeled as 2, polymer solution is labeled as 4. The solution moves through die swell 6 and is shown as elongation 8. A gas flow 10 may optionally be used to lay the polymer solution on the substrate 14.

Figure 2:
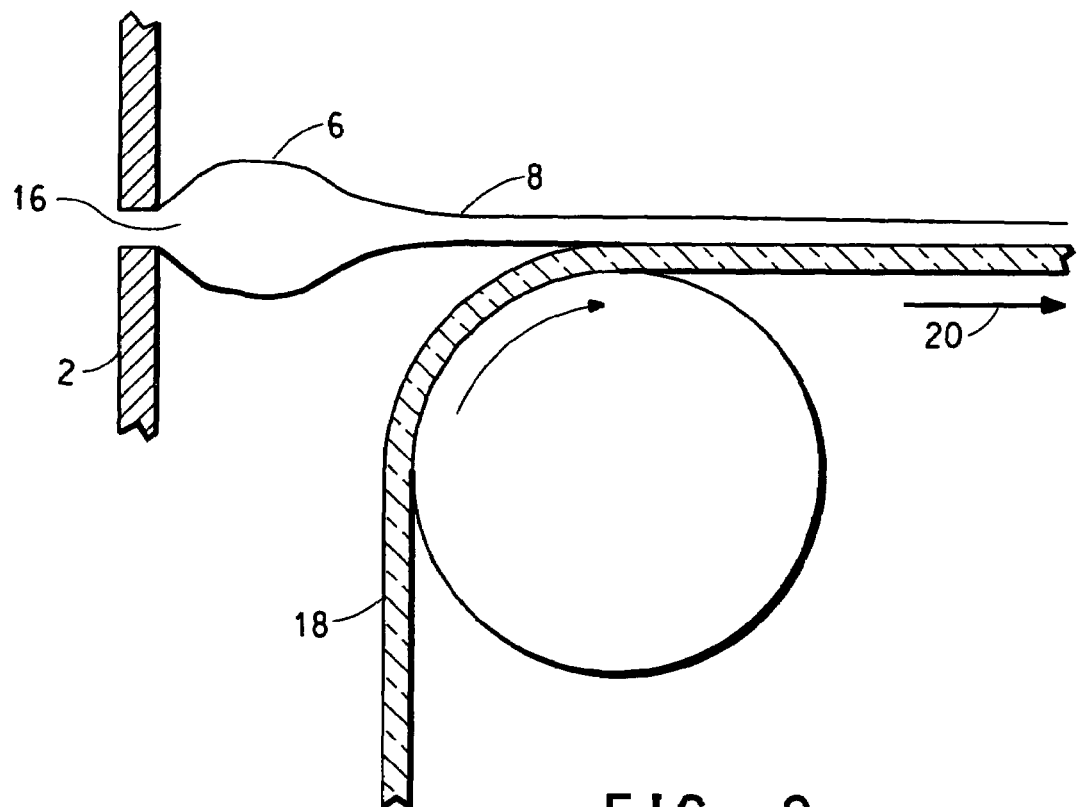
FIG. 2 shows a spun fiber being deposited on a flexible substrate.

Higher speed can be sustained when the printing and spinning directions are in alignment. This would be exemplified by spin-printing onto a flexible substrate where the surface of the substrate can be aligned with the direction of the spinnerettes. A second potential configuration where the polymer fiber 8 is deposited on a moving flexible substrate 18 is shown as FIG. 2. In these figures, it is noted that the printing head is fixed and the "flexible" substrate 18 is moving. While there are significant advantages to this approach, it is quite possible that the substrate can be fixed and the printing heads will move.

The polymer solution is forced through the die or spinnerette utilizing an adequate pressure to attain the spinning speed desired. The temperature of the process must be below the boiling point of the solvent. The polymer solution will typically be spin-printed at a temperature that is within the range of about 20° C. to about 70° C. when the solvent is water. The temperature will be determined by engineering of the process, the chosen solvent, its rate of evaporation, spinning speeds and other process variables. Temperatures above room temperature and controlled humidity conditions (primarily but not exclusively for aqueous-based systems) are desirable so that a uniform evaporation is easily maintained as atmospheric condition change. It is preferred that much of the solvent is removed from the polymer solution after passage through the die. Judicious choice of organic solvents would allow greater variation of the operating temperatures for the process.

As the solution-spun filament exits the spinnerette, it can be subjected to a drawing procedure. During the drawing procedure the solution spun filament is drawn to a total draw ratio of at least about 1:1 to 50:1. The total draw ratio will typically be within the range of about 5:1 to about 20:1 for circular filaments. It is advantageous to utilize drawing to decrease line size, increase uniformity and possibly orient acicular active components. Drawing of non-circular filament shapes will be minimal because there is a tendency of all shapes to approach circular upon drawing.

Figure 3:
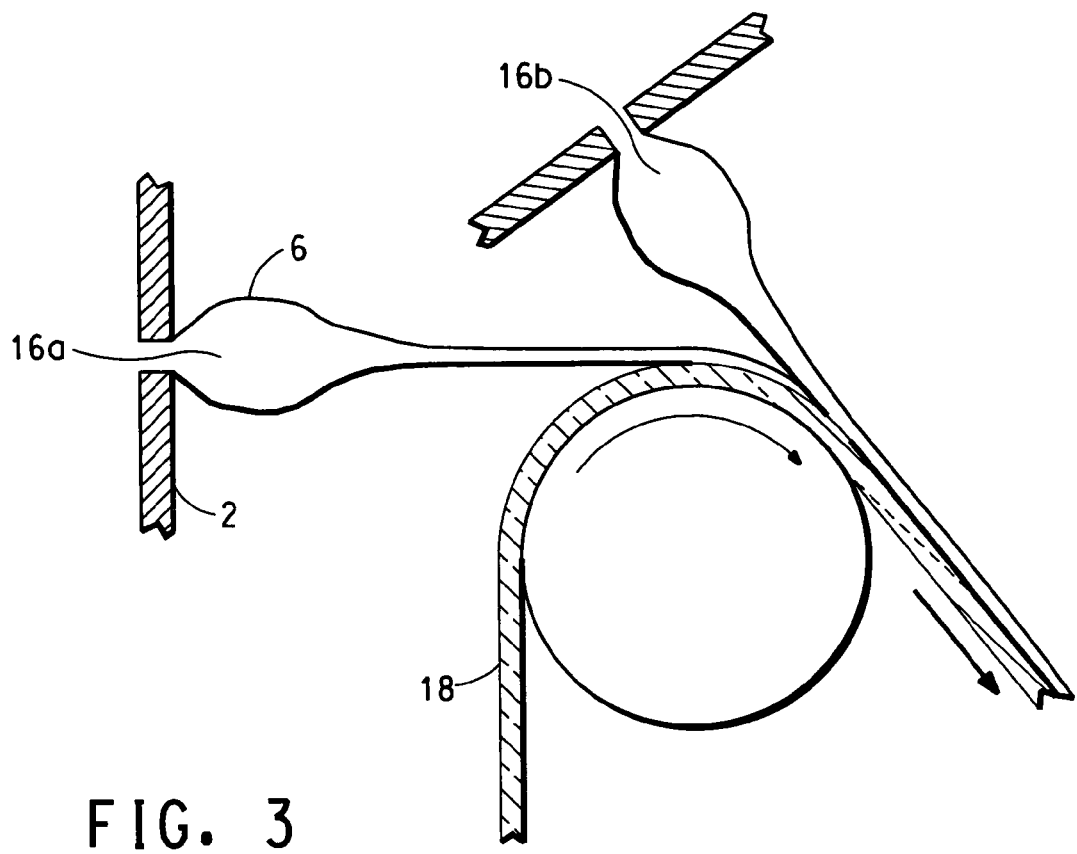
FIG. 3 shows simultaneous deposition on two fibers on top of one another.

Multiple spinnerettes may be employed and multiple active components may be printed in a single pass. This would be particularly advantageous on a flexible substrate. The two components could be laid one atop the other or side-by-side. One potential configuration is shown in FIG. 3 where the spinnerette is labeled as 2, the die swell is 6, the substrate is 18 and the polymer solutions are labeled as 16a and 16b.

For instance, the components of barrier ribs for plasma display panels could be printed between rows of a fugitive polymer onto a flexible sheet. Shaped spinning is useful to establish the desired aspect ratio of rib height to width and the shape would be maintained by the fugitive polymer component. The two-component system could be transferred to a glass substrates in registration and the fugitive polymer channels would assure that the barrier ribs would retain their shape during the transfer and firing processes.

Figure 4:
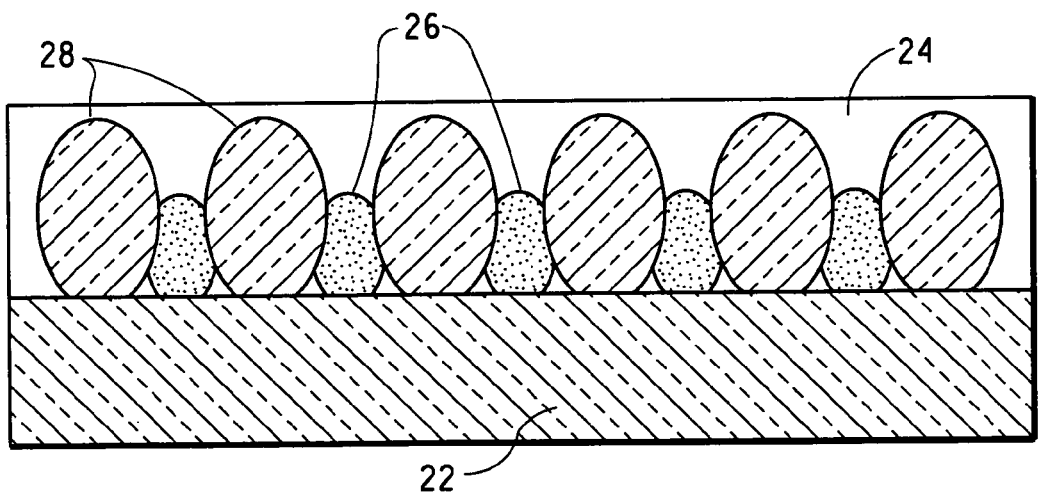
FIG. 4 shows a display element with phosphors and barrier ribs.

If a phosphor or other active components were contained in the fugitive polymer component, the phosphor would line the resulting channels after the firing process eliminating multiple steps in the manufacturing process. Extrusion coating of a barrier or cover layer may be carried out subsequent to the printing step yet all in the same overall process. The resulting structure would be that shown in FIG. 4 where the glass substrate is 22, the fugitive binder layer is 24, glass ceramic ribs are 28 and phosphors are 26.

The term "sheath-core" as used herein refers to fibers that consist of two components, one down the center core of the fiber and another that sheaths the inner component. By definition, the two components must be different in nature. In this application, the polymer components in the core and sheath may be the same or different. Most commonly, the active component in the core and sheath will be different. The sheath component need not contain any active component and in that case it would act largely as a spacer material to shield the core component during some particular step in the fabrication process. The preparation of sheath-core synthetic polymer fibers is well known in the art, as described by, e.g., Killian in U.S. Pat. No. 2,936,482, by Bannerman in U.S. Pat. No. 2,989,798, and by Lee in U.S. Pat. No. 4,059,949, and also in the art referenced herein above. A bicomponent spinning technique, which produces solid sheath-core bicomponent filaments of round cross-section is also known in the art and is described by Hernandez et al. in U.S. Pat. No. 5,458,971. It should be understood that known techniques for the production of sheath-core synthetic polymer fibers and of sheath-core bicomponent filaments as described above and in other prior publications may be used without departing from the spirit of the present invention.

Figure 5:
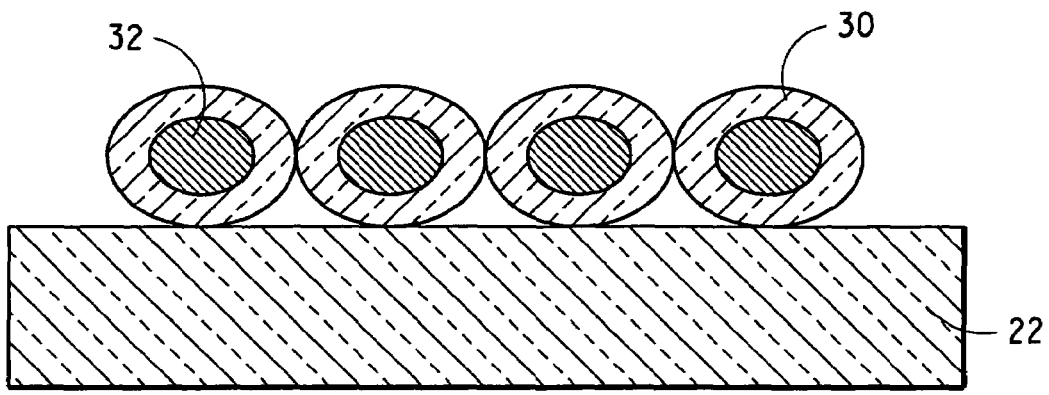
FIG. 5 shows a cross section of sheath/core fibers on a substrate.
Figure 6:
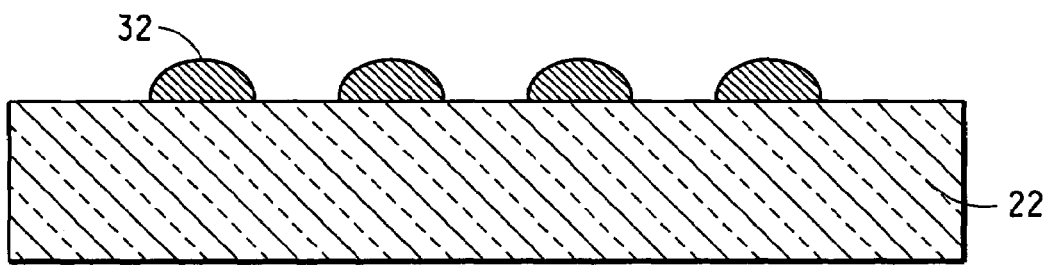
FIG. 6 shows a cross section of sheath/core fibers with a fugitive polymer sheath after firing to remove the fugitive polymer.

Spin-printing of core shell fibers in direct contact with adjacent fibers on the substrate can lead to several useful configurations. In the initial printing process, the configuration of the fibers viewed in the machine direction would be shown in cross section by FIG. 5, where the substrate is 22, the shell system is 30 and the conductive core is labeled 32. If the sheath component is a fugitive polymer, then it would be removed during the firing process and the remaining material would be in the configuration shown in FIG. 6.

Figure 7:
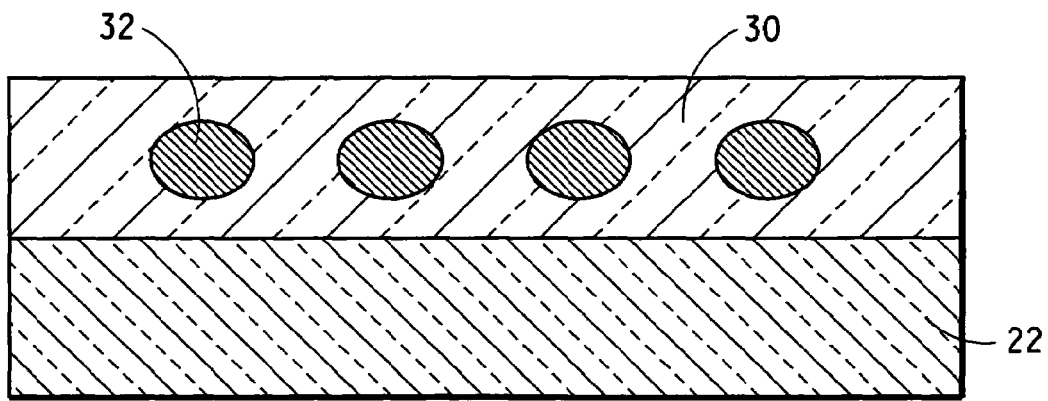
FIG. 7 shows a cross section of sheath/core fibers on a substrate where the sheaths have been sintered together.

This would be an additional means of preparing closely spaced wires if the core material was a conducting active phase. If the sheath material contained for example an insulator and the core 32 contained a conductor, then the resulting configuration, after firing, would be shown in FIG. 7. The conducting fibers would be encased in an insulating film. This configuration would have applicability in the preparation of plasma display panels and other display devices.

Figure 8:
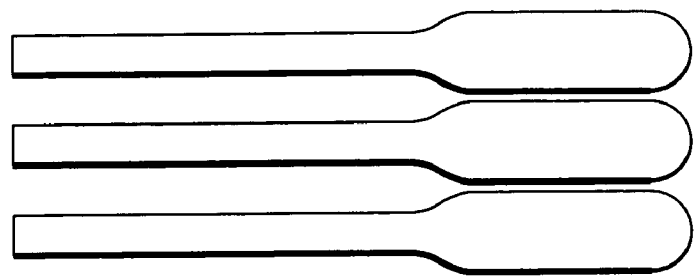
FIG. 8 shows a top view of parallel, deposited fibers where the fiber diameter has been increased by varying the relative translation speed of the orifice and the substrate.
Figure 9A:
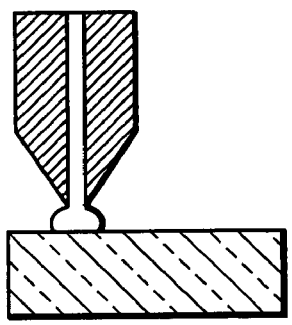
FIG. 9 is a diagram of the printing process based upon generating a reservoir on the surface of the substrate.
Figure 9B:
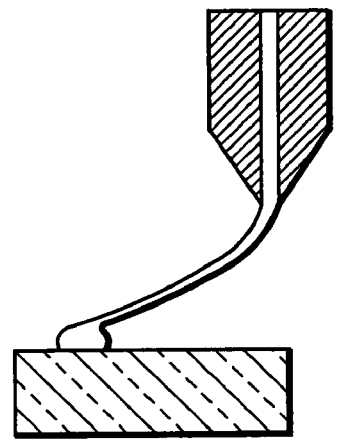
Figure 9C:
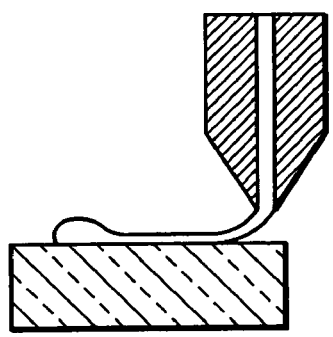
Figure 9D:
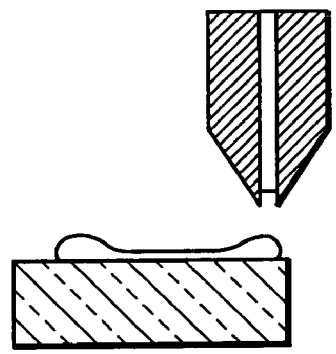

At times, in a video display, it is necessary to vary the dimensions of the conductor lines to better enable electrical contact at the sides of the display. For instance, the lines will widen as shown in FIG. 8. This widening is accomplished by decreasing the rate of translation of the substrate relative to the rate of the extrusion from the spinnerette. The reduced draw on the fiber causes it to be of greater dimension. The greater dimension is reflected in both the width of the line and the thickness. The enhanced thickness at the contact point ensures good contact with the electrical connector strips and enhanced resistance to scratching while the connector strip is being installed.

EXAMPLES

This invention is illustrated by the following examples that are merely for the purpose of illustration and are not to be regarded as limiting the scope of the invention or the manner in which it can be practiced.

Example 1

Demonstrating that the Technique Works with Non-Aqueous Systems

A solution of UHMW polydecene (estimated molecular weight greater than 2,000,000)(2.5 g) in hexane (50 mL) was prepared by cutting the sample of polydecene into small pieces and then placing the jar containing the polymer and solvent onto a roller mill (U.S. Stoneware Corp., Palestine Ohio) set on its lowest speed. Tumbling for 65 hours produced a viscoelastic, relatively homogeneous liquid or gel. The material could easily be drawn into long fibers.

A sample of Ferro silver (1.0 g, Ferro 7000 ultrafine silver powder, Ferro Corporation, Cleveland, Ohio) was dispersed in hexane (1 mL) in a 25 mL sample vial. A sample of polymer solution (1 mL) was added to the vial. Then an uncapped 1.5 mL vial was added to the sample vial. The capped sample vial was placed in a jar with padding and placed on the roller mill at its slowest speed for 24 hours. The small vial inside the sample vial served as a roller to disperse the silver.

The samples were transferred to a 1 mL syringe having a needle that had been cut off to a flat tip. Small samples were forced from the tip of the syringe needle and drawn across three side-by-side square glass slides (VWR-1302-50, 2 in sq) making relatively straight lines. The hexane/PD suspensions were highly viscoelastic and if not well adhered to the glass surface, would retract elastically. Nonetheless, they made very straight, fine lines containing silver.

Microscopic examination of the slides indicated that lines from 20-250 microns had been drawn. There were blemishes that one would expect from such a process, but the lines were remarkably good with very smooth edges and good uniformity in most sections.

Example 2

Demonstrating that the Technique Works with Conductive Materials in Aqueous Systems A sample of UHMW polyethyleneoxide (2 g, Aldrich, Milwaukee, Wis. 18,947-2, molecular weight about 5,000,000) was dispersed quickly into highly stirred hot water 50 mL) in a jar. The jar containing the UHMW PEO and water was placed onto a roller mill (U.S. Stoneware Corp., Palestine Ohio) set on its lowest speed. Tumbling for 65 hours produced a viscous, relatively homogeneous liquid or gel. The material could easily be drawn into long fibers.

A sample of Ferro silver (1.0 g) was dispersed in water (1 mL) in a 25 mL sample vial. A sample of polymer solution (1 mL) was added to the vial. Then an uncapped 1.5 mL vial was added to the sample vial. The sample vial was placed in a jar with padding and placed on the roller mill at its slowest speed for 24 hours.

The sample was transferred to a 1 mL syringes having a needle that had been cut off to a flat tip. Small samples were forced from the tip of the syringe needle and drawn across three side-by-side square glass slides (VWR-1302-50, 2 in sq) making relatively straight lines. The polymer adhered well to the slide and the slides could be separated with little effort.

Microscopic examination of the slides indicated that lines from 20-200 microns had been drawn and they had very smooth edges and good uniformity in sections. It was clear that the dispersion process had not been very effective because no real dispersant polymer had been included.

Example 3

Demonstrating that the Technique Works with Complex Additives and Adjuvants A sample (10 g) of fully formulated DuPont Fodel® (DC-204) photocurable silver conductor paste (60% silver by weight) was obtained from DuPont Micro Circuit Materials, Wilmington, Del. The major constituents by weight were silver (60%), trimethylpentanediol monoisobutyrate (10%), acrylic resin (6%), modified acrylate ester (3%), glass frit (3%), and other smaller components including isopropanol, diethylthioxanthone, ethyl 4-dimethylaminobenzoate, methyl methacrylate, methacrylic acid, and 2,2-dimethoxy-2-phenylacetophenone. The glass frit is composed of the component weight % of the following: $SiO_2$ (9.1), $Al_2O_3$ (1.4), PbO (77.0), $B_2O_3$ (12.5). The sample was combined with poly(ethylene oxide) (Aldrich, Milwaukee, Wis. 18,947-2, molecular weight about 5,000,000), and methanol (0.6 g). The slurry was placed in a 25 mL vial and placed on a roller mill (U.S. Stoneware Corp., Palestine Ohio) at slowest speed for 24 hr. Thus the UHMW PEO was well dispersed in the mixture.

A sample of polyvinylpyrrolidone (0.2 g, Aldrich, Milwaukee, Wis. 85,645-2, Batch 12731JA, Mw about 10,000) was dissolved in water (4 g) and swirled until dissolution was complete. This sample was then quickly added to the Fodel® slurry, shaken vigorously for several minutes and then placed on the roller mill for 24 hours. This formulation would give a sample containing 40% silver by weight.

A small sample of the resulting viscoelastic slurry was transferred to a 1 mL syringe having a needle that had been cut off to a flat tip. Small samples were forced from the tip of the syringe needle and drawn across adjacent, square glass slides making relatively straight lines. The polymer adhered well to the slides. The samples were dried at room temperature. Examination of the slides by optical microscopy indicated that lines from ranging from 100 to 330 microns had been drawn. Dispersion of the silver in the lines appeared to be uniform and excellent. The lines were good, with smooth edges and good uniformity.

A sample was fired in the belt oven at 500° C. over a period of 1 hr. Profilometry and resistivity of an unfired and a fired slide were measured and are given in the Table 1. The lines on the unfired slide did not conduct but those on the fired slide conducted well. The unfired widths seem to be wider than the fired, but that is an artifact of the hand-drawing technique.

TABLE 1

Unfired and fired profilometry and resistivity of a series of silver lines

| Line No. | Unfired | | Fired | | Fired |
| --- | --- | --- | --- | --- | --- |
| | Width (μm) | Height (μm) | Width (μm) | Height (μm) | Resistance (Ohms/cm) |
| 1 | 240 | 22.1 | 170 | 3.9 | 1.96 |
| 2 | 105 | 6.5 | 125 | 3.4 | 2.32 |
| 3 | 340 | 24.6 | 170 | 5.2 | 1.49 |
| 4 | 135 | 8.7 | 100 | 2.0 | 2.44 |
| 5 | 310 | 22.6 | 265 | 4.2 | 1.52 |
| 6 | 410 | 32.5 | 315 | 11.2 | 1.29 |
| 7 | 125 | 6.9 | 110 | 1.8 | 3.06 |
| 8 | 475 | 38.5 | 330 | 10.9 | 1.22 |

Example 4

Demonstrating that the Technique can Work with a Defined Range of Polymers, Dispersing Media and Concentrations Traditional spinning of a fiber is performed by forcing a viscoelastic polymer fluid through a small orifice while a take-up wheel draws the resulting filament. These polymers are normally forced through a spinneret hole using a syringe pump. The relationship between the syringe pump speed and the resulting spinning speed (called jet velocity) and the take-up velocity will be defined as "draw" and is calculated presuming the cross section of a perfect cylinder. Draw is closely related to filament radius, but draw is utilizing a moving system verses a static cylinder.

Using a Harvard PHD-4400 syringe pump (Harvard Apparatus, Inc., Holliston, Mass.) and a Custom Scientific Instruments (Newark N.J.) variable speed take-up wheel (CS-194T), a spun filament was successfully created. Using a pumping rate of 0.25 ml/min through a nominally 5 mil (127 μm) orifice the jet velocity was determined to be approximately 20 m/min. At a take-up rate of 53 m/min, the draw was calculated to be 2.7 and the diameter of the filament was calculated to be approximately 80 μm. While testing various polymers for spinning ability, a length between spinneret and take-up wheel was set to 1 cm. Polymer solutions that could be spun continuously for a minute or longer over this distance were considered to be a "viscoelastic polymer solution." Examples of solutions that passed this test are given in Table 2.

TABLE 2

Combinations of polymers, dispersing media and concentrations successfully spun.

| Polymer | Molecular weight | Dispersing vehicle | Concentration (% by weight) |
|---|---|---|---|
| Poly(ethylene oxide) | 9,000,000 | Water | 1 |
| Poly(ethylene oxide) | 5,000,000 | Water | 2 |
| Poly(acrylamide) | 6,000,000 | Water | 2 |
| Polyacrylamide | 18,000,000 | Water | 2 |
| Poly(acrylamide-co-acrylic acid) (Na salt 40%) | 10,000,000 | Water | 2 |
| Poly(acrylamide) | 6,000,000 | Water/20 wt % ethanol | 2 |
| Poly(ethylene oxide) | 5,000,000 | water/20% wt methanol | 2 |
| Poly(ethylene oxide) | 5,000,000 | water | 0.2 |
| Poly(acrylamide) | 6,000,000 | water | 0.3 |
| Poly(decene) | >2,000,000 | Hexane | 3 |

Examples of solutions that failed this test under the stated conditions are listed in Table 3.

TABLE 3

Combinations of polymers, dispersing media and concentrations that failed to meet the criteria for spinning.

| Polymer | Molecular weight | Dispersing vehicle | Concentration (% by weight) |
|---|---|---|---|
| Poly(ethylene oxide) | 100,000 | Water | 2 |
| Poly(ethylene oxide) | 9,000,000 | Water | 0.1 |
| Poly(acrylamide) | 23,000 | Water | 2 |
| Poly(sodium styrene-4-sulfonate) | 1,000,000 | Water | 2 |
| Carbomethoxy cellulose | 90,000 | Water | 2 |
| Poly(methyl methacrylate) | 996,000 | Methyl ethyl ketone | 2 |
| Poly(epichlorohydrin) | 700,000 | Methylene chloride | 2 |
| Dextran | 3-7,000,000 | water | 2 |
| Poly(vinylpyrrolidone) | 1,300,000 | water | 2 |

Example 5

Demonstrating that the Technique can be Automated

When a formed filament is drawn across the surface of a substrate and adhered to that substrate, it is the basis of spin printing. An Illiad PS2 robotic system from Charybdis Technologies (Carlsbad, Calif.) was modified for printing. A Harvard PHD-4400 syringe pump (Harvard Apparatus, Inc., Holliston, Mass.) was utilized to pump the spin printing ink to the robotic arm of the Illiad. The Illiad was programmed to draw parallel lines across a glass slide. The robotic arm motion was limited to speeds measured at a maximum of 24 m/min. Thus very low pumping speeds were required to obtain substantial draw of the filament. Pumping had to be initiated just before movement of the arm began. A series of for parallel lines having widths of approximately 100 µm width and a spacing of approximately 400 µm were obtained.

Example 6

Demonstrating that the Automated Technique Works with Conductive Materials

A modified CS-194T BioDot XYZ Dispense Platform from Cartesian Technologies (Genomic Solutions, Inc., Ann Arbor, Mich.) was found to be the better choice of printing platform. It utilizes a moving stage versus the overhead robotic arm of the Illiad. The BioDot programming also allowed for the use of multiple onboard syringe pumps coordinated with the moveable stage. As the table speed was still not as fast as desired, the onboard syringe pumps were manipulated to retain a proper spinning ratio.

The BioDot XYZ Dispense Platform utilizes a variable speed 250 µL syringe pump correlated to a moveable platform of maximum speed ca. 2.6 m/min. Custom made spin jets were cut to length from ART-10 Molecular BioProducts pipette tips #2139 (VWR Scientific, West Chester, Pa.) with an exit internal diameter of ca.45 µm. These jets are the equivalent to spinnerets in traditional fiber spinning. Using the BioDot AxSys software, a program was developed to draw 4 parallel lines at 55 mm lengths and widths <80 µm. These lines were drawn on a factory cleaned 10 cm diameter silicon wafer with <1 mm thickness. A silicon wafer was chosen due to its compatibility with a Scanning Electron Microscope (SEM). Each line was drawn <1 mm from the surface of the wafer as to minimize any drawing effects due to gravity. The final modification made was to manually fill the syringe, as the solution was too viscous to be filled under the suction of the pump. The syringe pump exhibited no problems in pushing this solution through the jet.

The technique used in spin printing was to first place the jet directly on the surface of the substrate. This creates a starting point to which the filament was anchored. The jet is then withdrawn from the surface by a distance of 3.0 mm. As the table moved horizontally in a straight line in the x-direction at constant speed, a filament was created and gravity pulled it to the surface of the substrate. When the first line was complete, the process began again in the reverse direction after shifting a known distance in the y-direction to achieve a series of parallel lines.

A suspension of nanoparticle silver (1.5 g, 10%) (Sumitomo Electric, White Plains, N.Y.), di(ethylene glycol) butyl ether (Dowanol™ DB) (1.5 g, 10%), and deionized water (11.7 g, 78%) was sonicated in a 20 ml vial using a Branson Sonifier 450 (VWR Scientific), duty cycle=constant, output control=5 for ca. 30 min. To the dark-red, fine suspension was added poly(ethylene oxide) (300 mg, 2%) (Avg. MW 5,000,000). The sample was vortexed overnight (Mini Vortexer, VWR, West Chester, Pa.) and further rolled for several hours on a roller mill (U.S. Stoneware Corp., Palestine OH) set on its lowest speed, yielding a viscoelastic suspension suitable for spin printing.

A series of four parallel lines having widths of approximately 100 µm width and a spacing of approximately 400 µm were obtained. The samples was heated in a belt furnace that ramped from room temperature to 525° C. in a period of 24 minutes, held at 525° C. for 18 minutes and then ramped back down to room temperature in 18 minutes. The lines had good conductivity.

Example 7

Demonstrating that the Technique Works with Conductive Materials at High Loadings Example 6 was repeated utilizing 40% silver suspension of Sumitomo nanoparticles Ag (6.0 g, 40%)(Sumitomo Electric, White Plains, N.Y.), di(ethylene glycol) butyl ether (Dowanol™ DB) (1.5 g, 10%), and deionized water (7.2 g, 48%) was sonicated in a 20 ml vial using a Branson Sonifier 450 (VWR Scientific), duty cycle=constant, output control=5 for ca. 30 min. To the dark-red, fine suspension was added poly(ethylene oxide) (300 mg, 2%) (Avg. MW 5,000,000). The sample was vortexed overnight with a Mini Vortexer (VWR, West Chester, Pa.) and further rolled for several hours on a roller mill (U.S. Stoneware Corp., Palestine OH) set on its lowest speed, yielding a viscoelastic suspension suitable for spin printing.

The BioDot XYZ Dispense Platform was utilized to print the composition on a glass slide at about 2.6 m/min. Custom made spin jets were cut to length from ART-10 Molecular BioProducts pipette tips #2139 (VWR Scientific, West Chester, Pa.) with an exit internal diameter of ca.45 µm. Four parallel lines at 55 mm lengths and widths of less than 80 µm were drawn on a cleaned glass slide. Each line was drawn <1 mm from the surface of the wafer. After printing, the sample was heated in the belt furnace. The lines had dimensions of <80 µm and a resistance of 4 ohm/cm.

Example 8

Demonstrating that the Technique with Photoactive Materials

Titanium dioxide (Aldrich, Milwaukee, Wis.) is a well known white pigment and absorber of UV radiation. It is also a photocatalyst for the oxidation of a wide variety of organic molecules. A suspension of $TiO_2$ nanopowder (50 mg, 0.32%), SDS (50 mg, 0.32%), and 15 ml deionized water was sonicated in a 20 ml vial using a Branson Sonifier 450 (VWR Scientific, West Chester, Pa.), duty cycle=constant, output control=5 for ca. 45 min. To the white suspension was added poly(ethylene oxide) (388 mg, 2.5%) (Avg. MW 5,000,000). The sample was vortexed for several hours and rolled overnight yielding a viscoelastic suspension suitable for spin printing. Lines were successfully printed as described above. The BioDot XYZ Dispense Platform was utilized to print the composition on a glass slide at about 2.6 m/min. Four parallel lines at 55 mm lengths and widths of less than 80 µm were drawn on a cleaned glass slide. Each line was drawn <1 mm from the surface of the wafer. After printing, the sample was heated in the belt furnace. The lines were white and had dimensions of 55 mm by <80 µm.

Example 9

Demonstrating that the Technique Works with Dielectric Materials

Barium titanate (Aldrich, Milwaukee, Wis.) is a well known high dielectric material useful in a number of electronic applications. A suspension of $BaTiO_3$ nanopowder (45 mg, 0.29%), SDS (30 mg, 0.19%), and 15 ml deionized water was sonicated in a 20 ml vial using a Branson Sonifier 450 (VWR Scientific), duty cycle=constant, output control=5 for ca. 45 min. To the white suspension was added poly(ethylene oxide) (387 mg, 2.5%) (Avg. MW 5,000,000). The sample was vortexed for several hours and rolled overnight yielding a viscoelastic suspension suitable for spin printing.

The BioDot XYZ Dispense Platform was utilized to print the composition on a glass slide at about 2.6 m/min. Custom made spin jets were cut to length from ART-10 Molecular BioProducts pipette tips #2139 (VWR Scientific, West Chester, Pa.) with an exit internal diameter of ca.45 µm. Four parallel lines at 55 mm lengths and widths of less than 80 µm were drawn on a cleaned glass slide. Each line was drawn <1 mm from the surface of the wafer. After printing, the sample was heated in the belt furnace. The lines were white and had dimensions of 55 mm by <80 um.

Example 10

Demonstrating that the Technique Works with Inorganic Oxide Materials

Bismuth oxide (Aldrich, Milwaukee, Wis.) is a yellow pigment and is a known antimicrobial. A suspension of $Bi_2O_3$ nanopowder (110 mg, 0.71%), SDS (30 mg, 0.19%), and 15 ml deionized water was sonicated in a 20 ml vial using a Branson Sonifier 450 (VWR Scientific), duty cycle=constant, output control=5 for ca. 45 min. To the yellow suspension was added poly(ethylene oxide) (389 mg, 2.5%) (Avg. MW 5,000, 000). The sample was vortexed for an hour and rolled overnight yielding an inhomogeneous viscoelastic suspension that was nonetheless suitable for spin printing. Lines were successfully printed as described above. Upon firing, the lines were white and had dimensions of 55 mm by <80 µm

Example 11

Demonstrating that the Technique Works on Flexible Polymeric Substrates and with High Silver Loading Silver lines were printed on a Kapton® polyimide film (DuPont, Wilmington, Del.) utilizing 50% silver suspension of silver nanoparticles (7.5 g, 50%) in di(ethylene glycol) butyl ether (Dowanol™ DB) (1.5 g, 10%), and deionized water (5.6 g, 37.5%) with poly(ethylene oxide) (300 mg, 2%) (Avg. MW 5,000,000) prepared as above. The sample was vortexed overnight with a Mini Vortexer (VWR, West Chester, Pa.) and further rolled for several hours on a roller mill (U.S. Stoneware Corp., Palestine OH) set on its lowest speed, yielding a viscoelastic suspension suitable for spin printing. The BioDot XYZ Dispense Platform was utilized to print the composition on the Kapton® film at about 2.6 m/min. Four parallel lines at 55 mm lengths and widths of less than 80 µm were drawn. Each line was drawn <1 mm from the surface of the film. After printing, the sample was heated on a hot plate to 200° C. for two hours. The lines had dimensions of 55 mm by <80 µm and were conductive.

Example 11

Demonstrating that the Technique Works on Ceramic Substrates

Silver lines were printed on an alumina ceramic plate utilizing a suspension of Sumitomo nanoparticle silver (6.0 g, 40%)(Sumitomo Electric, White Plains, N.Y.) in di(ethylene glycol) butyl ether (Dowanol™ DB) (1.5 g, 10%), and deionized water (7.2 g, 48%) with poly(ethylene oxide) (300 mg, 2%) (Avg. MW 5,000,000). The BioDot XYZ Dispense Platform was utilized to print the composition at about 2.6 m/min. Four parallel lines at 55 mm lengths and widths of less than 80 μm were drawn on the 5 cm×5 cm ceramic substrate. Each line was drawn <1 mm from the surface of the ceramic. After printing, the sample was heated on a hot plate to 200° C. for two hours and then again in the belt furnace. The lines had dimensions of 45 mm by <80 μm.

Example 12

Demonstrating that the Technique Works on Larger Substrates

Silver lines were printed on a glass plate utilizing a suspension of Sumitomo nanoparticle silver (1.5 g, 10%)(Sumitomo Electric, White Plains, N.Y.) in di(ethylene glycol) butyl ether (Dowanol™ DB) (1.5 g, 10%), and deionized water (11.7 g, 78%) with poly(ethylene oxide) (300 mg, 2%) (Avg. MW 5,000,000). The BioDot XYZ Dispense Platform was utilized to print the composition at about 2.6 m/min. Sets of four parallel lines at 180 mm lengths and widths of less than 80 μm were drawn on the 100 mm×200 mm glass substrate (Uniplate TLC plates from Analtech, Newark, Del., that had been cleaned). Each line was drawn <1 mm from the surface of the glass. After printing, the sample was heated on a hot plate to 200° C. for two hours. The lines had dimensions of 180 mm by <80 μm. Additional lines were drawn with dimensions as low as 25 μm. All of the lines had conductivity.

Example 13

Demonstrating that the Technique Works with Lower Polymer Loadings

A suspension of Sumitomo Ag nanoparticles (3.0 g, 20%) (Sumitomo Electric, White Plains, N.Y.), di(ethylene glycol) butyl ether (Dowanol™ DB) (1.35 g, 9%), and deionized water (10.5 g, 70%) was sonicated in a 20 ml vial using a Branson Sonifier 450 (VWR Scientific, West Chester, Pa.), duty cycle=constant, output control=5 for ca. 30 min. To the dark-red, fine suspension was added poly(ethylene oxide) (150 mg, 1.0%) (Avg. MW 5,000,000). The sample was vortexed overnight on a VWR Mini Vortexer and further rolled for several hours on a roller mill set on its lowest speed, yielding a viscoelastic suspension suitable for spin printing. The BioDot XYZ Dispense Plafform was utilized to print the composition on a clean glass slide at about 2.6 m/min. Four parallel lines at 55 mm lengths and widths of less than 80 μm were drawn. Each line was drawn <1 mm from the surface of the wafer. The line appeared to be good to the naked eye, but under microscopic examination was found to be subject to "mud cracking," a drying issue that can be corrected by the addition of adjuvants.

Example 14

Demonstrating that the Technique Works with Higher Polymer Loadings

A suspension of Sumitomo Ag nanoparticles (1.5 g, 10%) (Sumitomo Electric, White Plains, N.Y.), di(ethylene glycol) butyl ether (Dowanol™ DB) (1.5 g, 10%), and deionized water (11.6 g, 77.5%) was sonicated in a 20 ml vial using a Branson Sonifier 450 (VWR Scientific, West Chester, Pa.), duty cycle=constant, output control=5 for ca. 30 min. To the dark-red, fine suspension was added poly(ethylene oxide) (375 mg, 2.5%) (Avg. MW 5,000,000). The sample was vortexed overnight and further rolled for several hours on a roller mill set on its lowest speed, yielding a viscoelastic suspension suitable for spin printing. The BioDot XYZ Dispense Platform was utilized to print the composition on a clean glass slide at about 2.6 m/min. Four parallel lines at 55 mm lengths and widths of less than 80 μm were drawn successfully.

What is claimed is:

1. A process comprising:
   a) depositing from a dispensing orifice a reservoir of a deposit composition comprising between 0.1 and 70 percent by weight of functional phase particles and a viscoelastic polymer solution comprising an ultrahigh molecular weight polymer having a molecular weight greater than 1,000,000 which is soluble in a dispersing vehicle onto the surface of a substrate;
   b) contacting said reservoir with a needle or spinnerette wet by the composition;
   c) drawing a fiber from said reservoir by removing needle or spinnerette from the reservoir and away from the surface of said substrate;
   d) translating the finely pointed object to an other point above the substrate such that said fiber extends between said reservoir and said other point;
   e) depositing that fiber between said reservoir and another point on the substrate by contacting the needle or spinnerette to the substrate at that point;
   f) evaporating the dispersing vehicle from the deposited fiber resulting in the functional phase particles being affixed to the substrate in an image and
   g) optionally heating the substrate and deposited fiber to a temperature sufficient to effect removal of organic components.

2. The process of claim 1 wherein the weight fraction of the functional phase particles is between 0.5 and 50 percent of the deposit composition.

3. The process of claim 1 wherein the weight fraction of the functional phase particles constitute between 1 and 30 percent by weight of the deposit composition.

4. The process of wherein the weight fraction of the ultrahigh molecular weight polymer constitutes between 0.2 and 5 percent by weight of the deposit composition.

5. The process of claim 1 wherein the weight fraction of the ultrahigh molecular weight polymer constitutes between 0.5 and 3 percent by weight of the deposit composition.

6. The process of claim 1 wherein the deposit composition further comprises between 0.02 and 5 percent by weight of an inorganic binder based on the total weight of the deposit composition.

7. The process of claim 1 wherein the deposit composition further comprises between 0.02 and 5 percent by weight of an adjuvant based on the total weight of the deposit composition.

8. The process of claim 1 wherein the functional phase particles are of average dimensions of less than 100 nanometers.

9. The process of claim 1 where the functional phase is selected from the group consisting of a conductor, a dielectric, an insulator and a phosphor.

10. The process of claim 9 where the functional phase is silver.

11. The process of claim 1 wherein the dispersing vehicle is selected from the group consisting of water and hydrocarbon.

12. The deposit composition of claim 1 wherein the ultra-high molecular weight polymer is selected from the group consisting of poly(ethylene oxide)s, poly(acrylamide)s and poly(α-olefins).

13. The process of claim 1 wherein the fiber is a sheath/core fiber comprising a sheath polymer and core polymer.

14. The process of claim 13 wherein the sheath polymer consists of comprises a fugitive polymer only.

15. The process of claim 13 wherein the sheath polymer contains an active component and the core polymer contains a conductive component, leaving a layer of the active component containing encapsulated conductors on the substrate after firing.

16. The process of claim 1 in which two or more layers are printed onto the substrate one atop the other.

17. The process of claim 1 in which two or more layers are printed onto the substrate atop the other and in which the consecutive layers contain different active components or adjuvants.

18. The process of claim 1 wherein the surface of the substrate has been chemically modified to have a surface energy different than that of the natural surface energy of the substrate to make it more non-wetting to minimize spreading of the deposit composition.

19. The process of claim 18, further comprising the step of modifying a first portion of said substrate, wherein said first portion is modified to have a surface energy that is different than the surface energy on a second portion of said substrate, and wherein said first portion is adapted to confine said deposited composition.

20. The process of claim 19, further comprising the step of modifying a first portion of said substrate, wherein said first portion is adapted to confine said deposited composition.

21. The process of claim 1 wherein the deposit composition is heated to a temperature from 20° C. to 70° C.

22. The process of claim 1 wherein the deposit composition is deposited into preformed channels on the substrate wherein said preformed channels have a width less than 100 μm.

23. The process of claim 1 wherein the substrate is rigid.

24. The process of claim 1 wherein the substrate is selected from the group consisting of glass, ceramic and polymer.

25. The process of claim 24 wherein the substrate is a semiconductor.

26. The process of claim 1 wherein the substrate is flexible.

27. The process of claim 1 wherein the fiber from the orifice is touched to the substrate to establish adhesion between the fiber and the substrate.

28. The process of claim 1 wherein the width of the resulting image is modulated by modulating the draw ratio of the fiber wherein said draw ratio is from 5:1 to 20:1.

29. An article manufactured by the process of claim 1.

30. An article of claim 29 wherein the article is selected from the group consisting of a display device, a plasma display panel, a field emission display device, a liquid crystal display device, a solar cell panel, an electrochemical cell, a printed circuit, an antenna, a shielding device for electromagnetic radiation, a resistance heater device for automobile windows, an electrochromic window device, microwave circuits, control modules, and EKG electrodes.

31. The article of claim 29 wherein the substrate is selected from the group consisting of a polymer, glass and ceramic.

32. The article of claim 31 wherein the substrate is a semiconductor.

33. The process of claim 1 wherein a spinnerette serves both as the dispensing orifice and the finely pointed object.

34. The process of claim 1 wherein lines are drawn from the same reservoir to several different locations on the substrate.

35. The process of claim 1 wherein steps a), b) c), d) and e) are all one continuous process.

* * * * *

UNITED STATES PATENT AND TRADEMARK OFFICE
CERTIFICATE OF CORRECTION

PATENT NO. : 7,618,704 B2  Page 1 of 1
APPLICATION NO. : 10/953679
DATED : November 17, 2009
INVENTOR(S) : Ittel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1351 days.

Signed and Sealed this

Twenty-sixth Day of October, 2010

David J. Kappos
*Director of the United States Patent and Trademark Office*